(12) United States Patent
Kang

(10) Patent No.: US 11,417,664 B2
(45) Date of Patent: Aug. 16, 2022

(54) SEMICONDUCTOR DEVICE

(71) Applicant: SAMSUNG ELECTRONICS CO., LTD., Suwon-si (KR)

(72) Inventor: Jongin Kang, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 60 days.

(21) Appl. No.: 17/034,652

(22) Filed: Sep. 28, 2020

(65) Prior Publication Data
US 2021/0257373 A1    Aug. 19, 2021

(30) Foreign Application Priority Data

Feb. 18, 2020    (KR) ........................ 10-2020-0019522

(51) Int. Cl.
*H01L 27/108* (2006.01)
*G11C 5/06* (2006.01)

(52) U.S. Cl.
CPC ........ *H01L 27/10823* (2013.01); *G11C 5/063* (2013.01); *H01L 27/10814* (2013.01); *H01L 27/10855* (2013.01); *H01L 27/10876* (2013.01); *H01L 27/10885* (2013.01)

(58) Field of Classification Search
CPC combination set(s) only.
See application file for complete search history.

(56) References Cited

U.S. PATENT DOCUMENTS 8,309,449 B2    11/2012 Jeong et al.
8,405,062 B2    3/2013 Yin et al.

2015/0294923 A1*    10/2015 Shin .................. H01L 27/10855
                                                        257/532
2017/0271340 A1*    9/2017 Kim .................. H01L 27/10823
2018/0158526 A1    6/2018 Kim et al.
(Continued)

FOREIGN PATENT DOCUMENTS

CN    101383321    3/2009
CN    108987397    12/2018
(Continued)

OTHER PUBLICATIONS

Taiwan Office Action issued in corresponding Taiwan Patent Application No. 109139916 dated Oct. 7, 2021.

*Primary Examiner* — Hsien Ming Lee
(74) *Attorney, Agent, or Firm* — F. Chau & Associates, LLC

(57) ABSTRACT

A semiconductor device includes a substrate including a first region having a first trench and a second region having a second trench. A first buried insulation layer pattern is disposed in the first trench. The second trench includes the first buried insulation layer pattern, a second buried insulation layer pattern, and a third buried insulation layer pattern sequentially stacked therein. A first buffer insulation layer is disposed on the substrate in the first and second regions and has a flat upper surface. A second buffer insulation layer is disposed on the first buffer insulation layer. A bit line structure is disposed on the first and second regions. A first portion of the bit line structure is disposed on the second buffer insulation layer and has a flat lower surface. A second portion of the bit line structure directly contacts a surface of the substrate in the first region.

19 Claims, 24 Drawing Sheets

(56) References Cited

U.S. PATENT DOCUMENTS

2018/0350818 A1* 12/2018 Yoon ................ H01L 27/10897
2019/0139963 A1    5/2019 Hong et al.

FOREIGN PATENT DOCUMENTS

| CN | 109768014 | 5/2019 |
| JP | 20160154194 | 8/2016 |
| KR | 10-2008-0010621 | 1/2008 |
| KR | 1019712 | 3/2011 |
| KR | 10-2016-0087667 | 7/2016 |
| KR | 1744072 | 6/2017 |

* cited by examiner

SEMICONDUCTOR DEVICE

CROSS-REFERENCE TO RELATED APPLICATION

This application claims priority under 35 U.S.C. § 119 to Korean Patent Application No. 10-2020-0019522, filed on Feb. 18, 2020, in the Korean Intellectual Property Office, the disclosure of which is incorporated by reference in its entirety herein.

1. TECHNICAL FIELD

The present inventive concepts relate to a semiconductor device. More particularly, the present inventive concepts relate to a dynamic random access memory (DRAM) device.

2. DISCUSSION OF RELATED ART

As the integration level of DRAM devices increase, operating characteristics of memory cells may be changed depending on a uniformity and/or a morphology of surfaces of layers on a substrate. When the surfaces of the layers are non-uniform, defects of patterns formed on the layers may occur.

SUMMARY

Exemplary embodiments provide a semiconductor device having improved characteristics.

Exemplary embodiments provide a method of manufacturing a semiconductor device having improved characteristics.

According to an exemplary embodiment of the present inventive concepts, a semiconductor device includes a substrate including a first region having a first trench and a second region having a second trench. A first buried insulation layer pattern is disposed in the first trench. The second trench includes the first buried insulation layer pattern, a second buried insulation layer pattern, and a third buried insulation layer pattern sequentially stacked therein. A first buffer insulation layer is disposed on the substrate in the first and second regions and has a flat upper surface. A second buffer insulation layer is disposed on the first buffer insulation layer. A bit line structure is disposed on the first and second regions. A first portion of the bit line structure is disposed on the second buffer insulation layer and has a flat lower surface. A second portion of the bit line structure directly contacts a surface of the substrate in the first region.

According to an exemplary embodiment of the present inventive concepts, a semiconductor device includes a substrate including a first region having a first trench and a gate trench and a second region having a second trench. A first buried insulation layer pattern is disposed in the first trench. The second trench includes the first buried insulation layer pattern, a second buried insulation layer pattern, and a third buried insulation layer pattern sequentially stacked therein. A first buffer insulation layer is disposed on the substrate in the first and second regions, the first buffer insulation layer having a flat upper surface. A second buffer insulation layer is disposed on the first buffer insulation layer. A gate structure is disposed in the gate trench. A bit line structure is disposed on the first and second regions. The bit line structure extends from the first region to the second region. A first portion of the bit line structure is disposed on the second buffer insulation layer, and the first portion of the bit line structure has a flat lower surface. A second portion of the bit line structure directly contacts a surface of the substrate in the first region. The bit line structure is disposed on the second region has a flat upper surface and a flat lower surface.

According to an exemplary embodiment of the present inventive concepts, a method of manufacturing a semiconductor device includes etching a substrate including a first region and a second region to form a first trench in the first region and a second trench in the second region. A first buried insulation layer pattern is formed in the first trench. The first buried insulation layer pattern, a second buried insulation layer pattern and a third buried insulation layer pattern are sequentially stacked in the second trench. A first buffer insulation layer is formed on the substrate in the first and second regions. The first buffer insulation layer has a flat upper surface. A second buffer insulation layer is formed on the first buffer insulation layer. A bit line structure is formed on the first and second regions. A first portion of the bit line structure is formed on the second buffer insulation layer, and the first portion of the bit line structure has a flat lower surface.

In exemplary embodiments of the present inventive concepts, a surface of a layer on the substrate may be flat so that structures and/or patterns formed on the layer may be uniformly formed over an entire of the substrate. Further, the surface of the layer on the substrate may have no protrusion at an edge portion of a memory cell region. Thus, a cutting defect of the bit line structure due to the protrusion at the edge portion may be decreased.

BRIEF DESCRIPTION OF THE DRAWINGS

Exemplary embodiments of the present inventive concepts will be more clearly understood from the following detailed description taken in conjunction with the accompanying drawings.

FIGS. 1, 3-10, 12-16, 18-19 and 21-22 are cross-sectional views illustrating a method of manufacturing a semiconductor device in accordance with exemplary embodiments of the present inventive concepts.

FIG. 17 is a cross-sectional view illustrating a comparative example of a method of manufacturing a semiconductor device.

FIGS. 2, 11 and 20 are plan views illustrating a method of manufacturing a semiconductor device in accordance with exemplary embodiments of the present inventive concepts.

FIG. 23 is an enlarged cross-sectional view of a portion of a bit line structure in accordance with an exemplary embodiment of the present inventive concepts.

FIG. 24 is a cross-sectional view illustrating a method of manufacturing a semiconductor device and a semiconductor device in accordance with and exemplary embodiment of the present inventive concepts.

DETAILED DESCRIPTION OF EXEMPLARY EMBODIMENTS

FIGS. 1 to 24 are cross-sectional views and plan views illustrating a method of manufacturing a semiconductor device according to exemplary embodiments of the present inventive concepts. Particularly, FIGS. 2, 11 and 20 are plan views, and FIGS. 1, 3 to 10, 12 to 19 and 21 to 24 are cross-sectional views according to exemplary embodiments of the present inventive concepts. Each of the cross-sectional views includes cross-sections cut along lines A-A', B-B', and C-C' of the plan views. FIG. 23 is an enlarged cross-sectional view of a portion of a bit line structure according to exemplary embodiments of the present inventive concepts. FIG. 17 shows a comparative example in which a protrusion remains in a second region.

Figure 1:
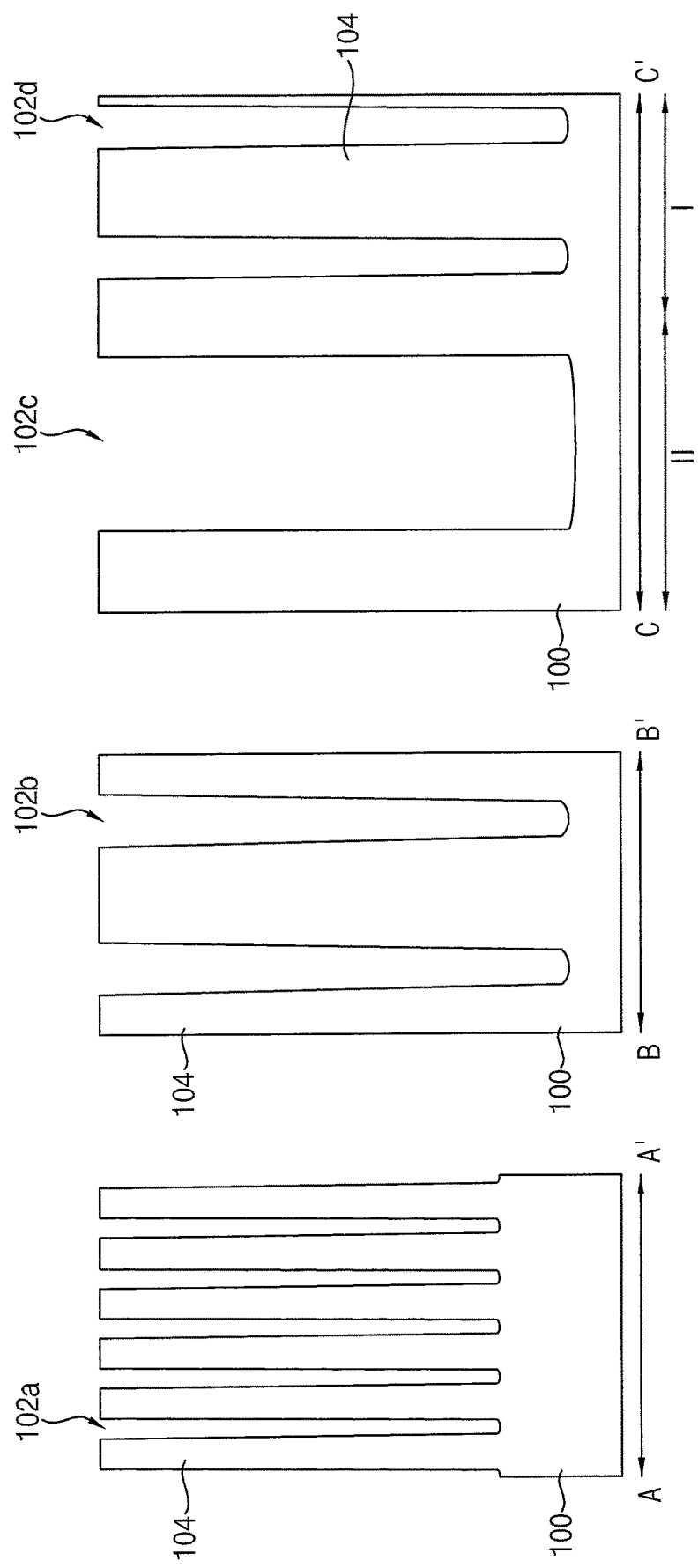
FIGS. 1 to 24 represent non-limiting, exemplary embodiments as described herein.
Figure 2:
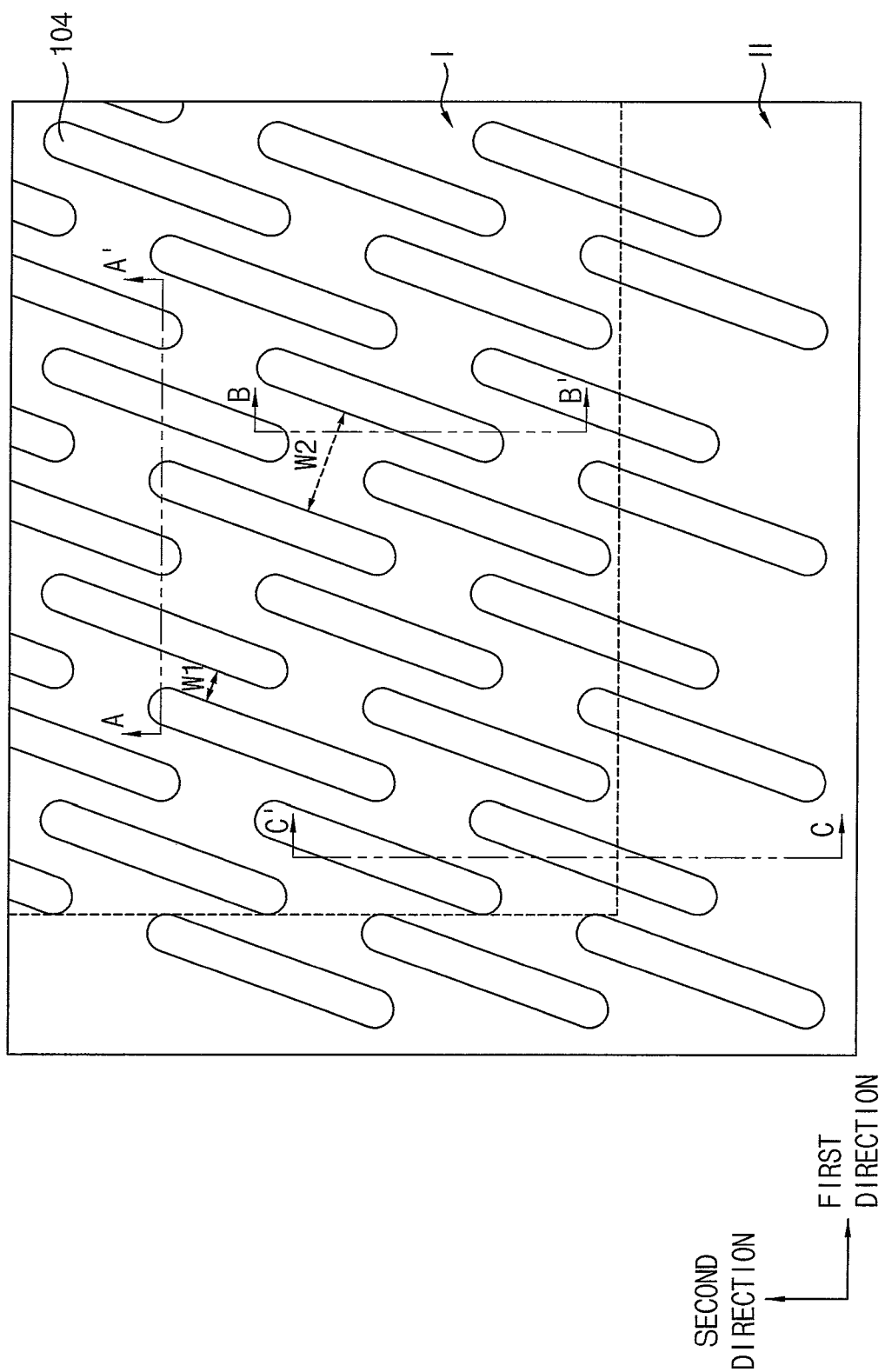

Referring to the exemplary embodiments of FIGS. 1 and 2, a substrate 100 may include a cell region and a core/peripheral region. The cell region may be an area for forming memory cells, and the core/peripheral region may be an area for forming peripheral circuits and core circuits. Hereinafter, only the cell region is described for convenience of explanation.

The cell region may include a first region I in which memory cells are formed and a second region II surrounding an edge of the first region I in which dummy cells are formed. For example, the first region I of the cell region may include a plurality of memory cells and the second region II of the cell region may include a plurality of dummy cells. For example, the second region II may be disposed between the first region I and the core/peripheral region. In each sectional view, cross sections of A-A' and B-B' show the first region I, and a cross section of C-C' shows both the first region I and the second region II.

A first mask pattern may be formed on the substrate 100. The substrate 100 may be etched using the first mask pattern as an etch mask to form first to fourth trenches 102a, 102b, 102c, 102d. An upper surface of the substrate 100 on which the first to fourth trenches 102a, 102b, 102c, and 102d are not formed may serve as active regions. Hereinafter, for convenience of descriptions, the active regions formed in the first and second regions I and II are referred to as first active patterns 104. As shown in the exemplary embodiment of FIG. 2, the first active patterns 104 may be arranged in a plane defined by a first direction and a second direction that are parallel to an upper surface of the substrate 100 and which cross each other. For example, as shown in the exemplary embodiment of FIG. 2, the first direction and the second direction may be perpendicular to each other. However, exemplary embodiments of the present inventive concepts are not limited thereto.

According to intervals between the first active patterns 104, an inner width of each of the first to fourth trenches 102a, 102b, 102c, 102d may be different from each other. For example, the inner width of each of the first to fourth trenches 102a, 102b, 102c, 102d may be different depending on positions of the substrate 100.

As shown in the exemplary embodiment of FIG. 2, in the first region I, the trenches have a portion having a first width W1 and a portion having a second width W2 that is greater than the first width W1.

In the cross-sectional views, the first to fourth trenches 102a, 102b, 102c, 102d may have different widths to each other. For convenience of descriptions, in each of the cross-sectional views, a trench shown in A-A' is referred to as a first trench 102a, and a trench shown in B-B' is referred to as a second trench 102b. In trenches shown in C-C' of the cross-sectional views, a trench formed in the second region II is referred to as a third trench 102c, and a trench formed in the first region I is referred to as a fourth trench 102d. The third trench 102c formed in the second region II may have a width that is greater than a width of each of the first, second and fourth trenches 102a, 102b, and 102d formed in the first region I. In an exemplary embodiment, the third trench 102c may have a width that is greater than a maximum width (e.g., the second width W2) of the trenches formed in the first region I. The second trench 102b may have a width that is greater than the width of the first trench 102a.

Figure 3:
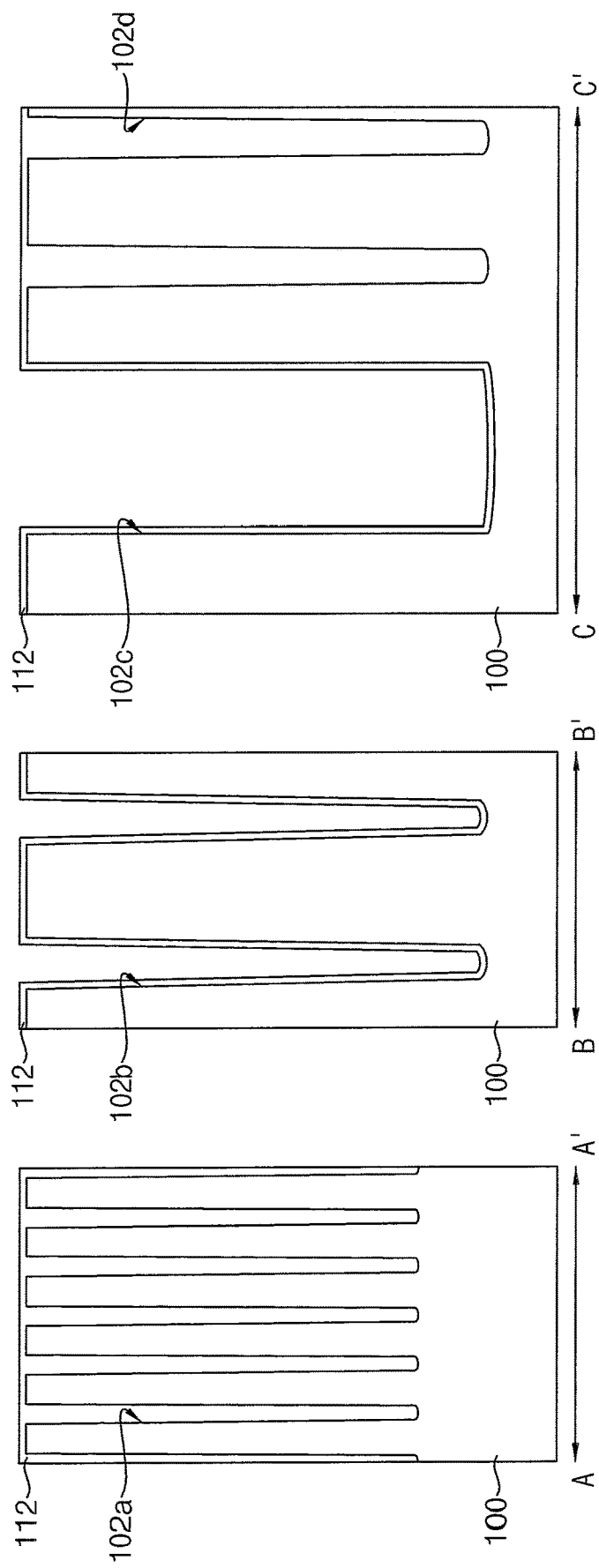

Referring to the exemplary embodiment of FIG. 3, a polysilicon layer may be conformally formed on inner surfaces of the first to fourth trenches 102a, 102b, 102c, and 102d and an upper surface of the substrate 100. In an exemplary embodiment, a thermal oxidation of the polysilicon layer may be performed to form a first oxide layer.

A first insulation layer 112 may be formed on the first oxide layer. As shown in the exemplary embodiment of FIG. 3, the first insulation layer 112 may be formed to completely fill the first trench 102a and the fourth trench 102d. However, the first insulation layer 112 may not completely fill the second and third trenches 102b and 102c having the width greater than the width of the first trench 102a. The first insulation layer 112 may be conformally formed on the inner surfaces of the second and third trenches 102b and 102c and the upper surface of the substrate 100.

In an exemplary embodiment, the first insulation layer 112 may include at least one compound selected from silicon oxide, silicon nitride, and the like. The materials of the first insulation layer 112 may be used in a single layer or in a lamination of two or more layers. For example, the first insulation layer 112 may include the silicon oxide. In this embodiment, the first insulation layer 112 may include a same material as a material of the first oxide layer. For example, the first insulation layer 112 and the first oxide layer may be merged with each other.

Figure 4:
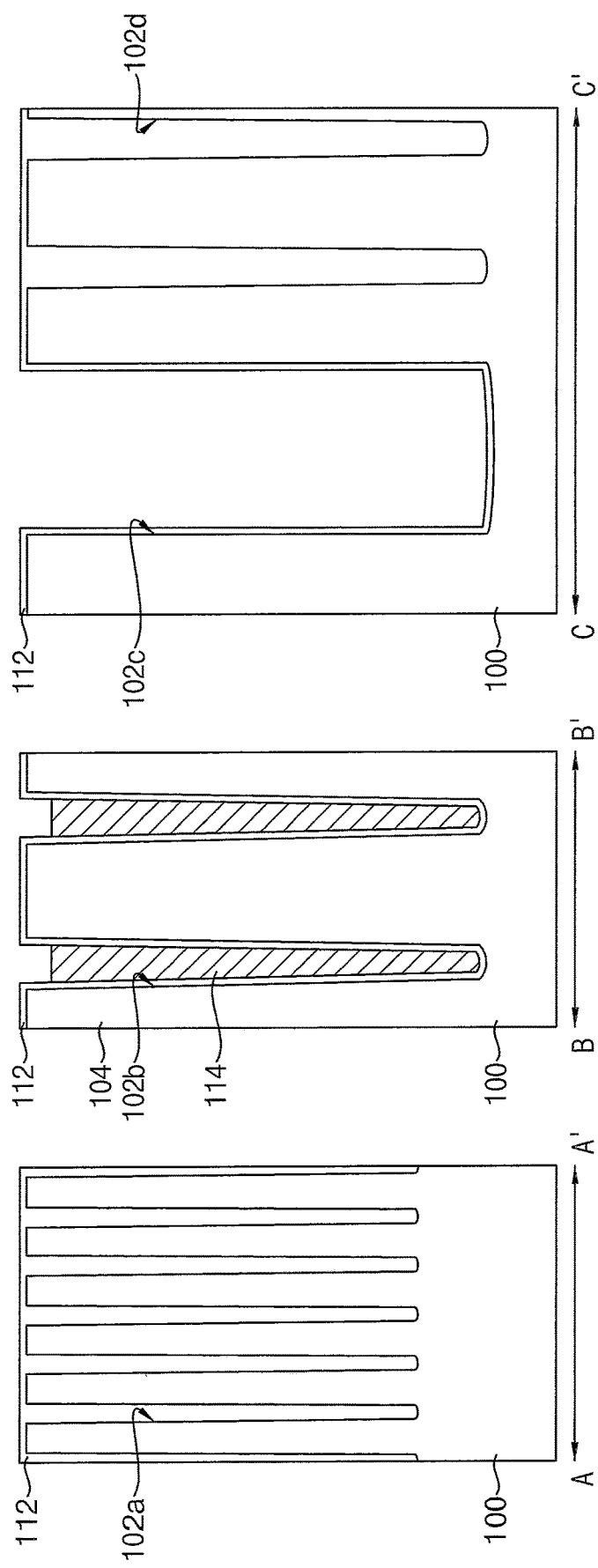

Referring to the exemplary embodiment of FIG. 4, a second insulation layer including a material that is different from the material of the first insulation layer 112 may be conformally formed on the first insulation layer 112. The second insulation layer may completely fill the second trench 102b. However, the second insulation layer may not completely fill the third trench 102c. The second insulation layer may be conformally formed on the inner surface of the third trench 102c. In an exemplary embodiment, the second insulation layer may include silicon nitride.

Thereafter, the second insulation layer may be removed by a predetermined thickness. In an exemplary embodiment, the removing process may include an isotropic etching process or a cleaning process. However, exemplary embodiments of the present inventive concepts are not limited thereto.

In the removing process, the second insulation layer formed on the first and fourth trenches 102a and 102d and the substrate 100 in the first region I and the second insulation layer formed in the second region II may be removed. However, the second insulation layer filling the second trench 102b may be relatively thick in a vertical direction, and thus the second insulation layer may remain only in the second trench 102b. Therefore, as shown in the exemplary embodiment of FIG. 4, a second insulation layer pattern 114 may be formed in the second trench 102b. The second insulation layer pattern 114 remaining in the second trench 102b may not completely fill the second trench 102b. In this exemplary embodiment, an upper surface of the second insulation layer pattern 114 may be lower than an upper surface of the first active pattern 104 adjacent to the second insulation layer pattern 114.

Figure 5:
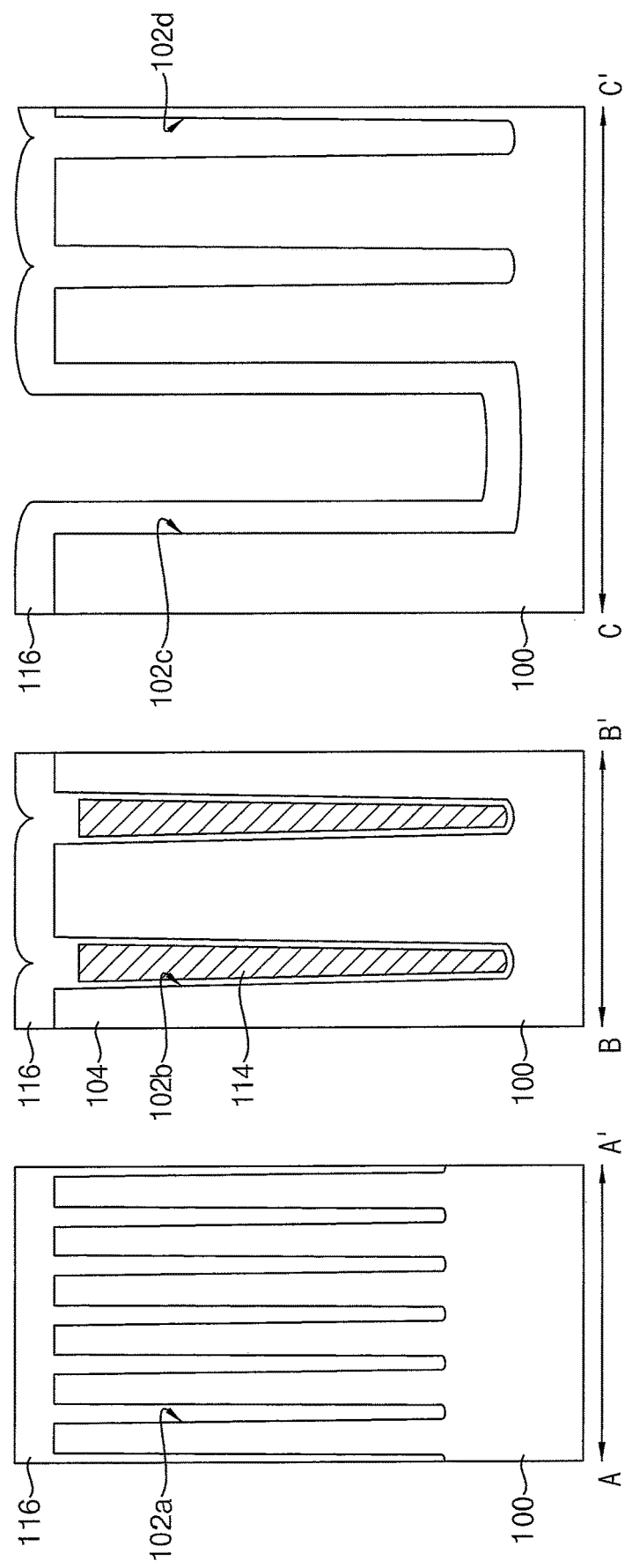

Referring to the exemplary embodiment of FIG. 5, a third insulation layer may be formed on upper surfaces of the first insulation layer 112 in the first and second regions I, II and on an upper surface of the second insulation layer pattern 114 in the second trench 102b in the first region I.

The third insulation layer may not completely fill the third trench 102c. For example, the third insulation layer may be conformally formed on the inner surface of the third trench 102c. In an exemplary embodiment, the third insulation layer may include silicon oxide.

The third insulation layer may be formed to fill the second trench 102b. For example, the third insulation layer may be disposed above the second insulation layer pattern 114 to completely fill the second trench 102b. Due to a step difference between the second insulation layer pattern 114 and the first insulation layer 112, a recess portion may be formed on the upper surface of the third insulation layer. For example, the upper surface of the third insulation layer may not be flat, and may be locally curved.

In an exemplary embodiment, the first insulation layer 112 and the third insulation layer may include the same material, so that the first insulation layer 112 and the third insulation layer may be merged with each other. Hereinafter, a merged layer of the first and third insulation layers are referred to as a first buried insulation layer 116. The first buried insulation layer 116 is conformally disposed in the third trench 102c in the second region II.

Figure 6:
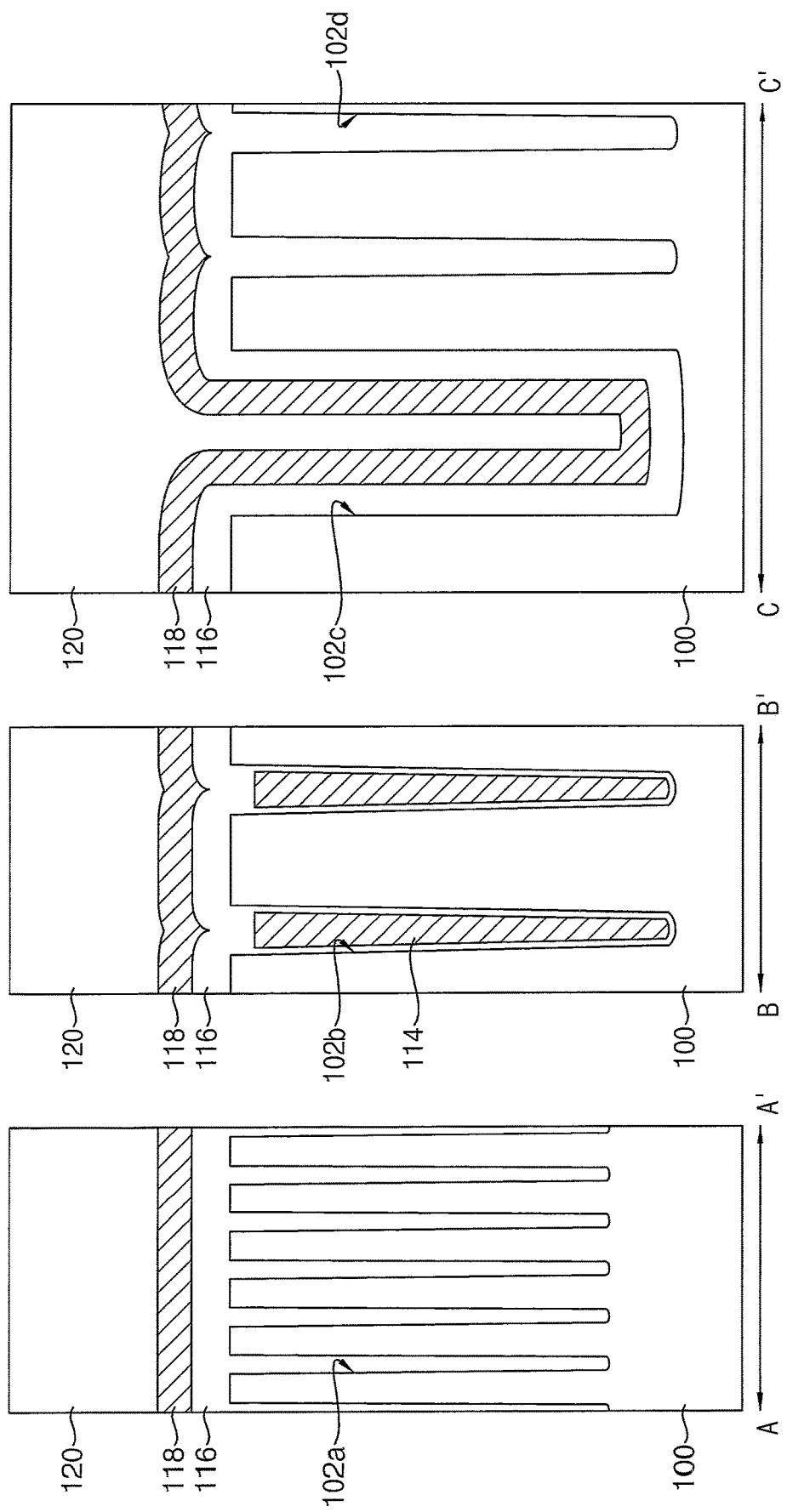

Referring to the exemplary embodiment of FIG. 6, a second buried insulation layer 118 including a material that is different from the material of the first buried insulation layer 116 may be formed on the first buried insulation layer 116 in the first and second regions I, II.

As shown in the exemplary embodiment of FIG. 6, the second buried insulation layer 118 may not completely fill the third trench 102c. For example, the second buried insulation layer 118 may be conformally formed on the inner surface of the third trench 102c. In an exemplary embodiment, the second buried insulation layer 118 may include silicon nitride.

A third buried insulation layer 120 including a material that is different from the material of the second buried insulation layer 118 may be formed on the second buried insulation layer 118 in the first and second regions I, II.

The third buried insulation layer 120 may be formed to completely fill the third trench 102c. The third buried insulation layer 120 may include an insulation material having an excellent gap filling characteristic. For example, in an exemplary embodiment, the third buried insulation layer 120 may include silicon oxide.

The second and third buried insulation layers 118 and 120 may not be formed in the first trench 102a, the second trench 102b, and the fourth trench 102d of the first region I. The second insulation layer pattern 114 may be formed in the second trench 102b of the first region I. The first buried insulation layer 116 may be formed in the first trench 102a and the fourth trench 102d of the first region I.

The first to third buried insulation layers 116, 118, and 120 may be sequentially stacked in the third trench 102c of the second region II.

Figure 7:
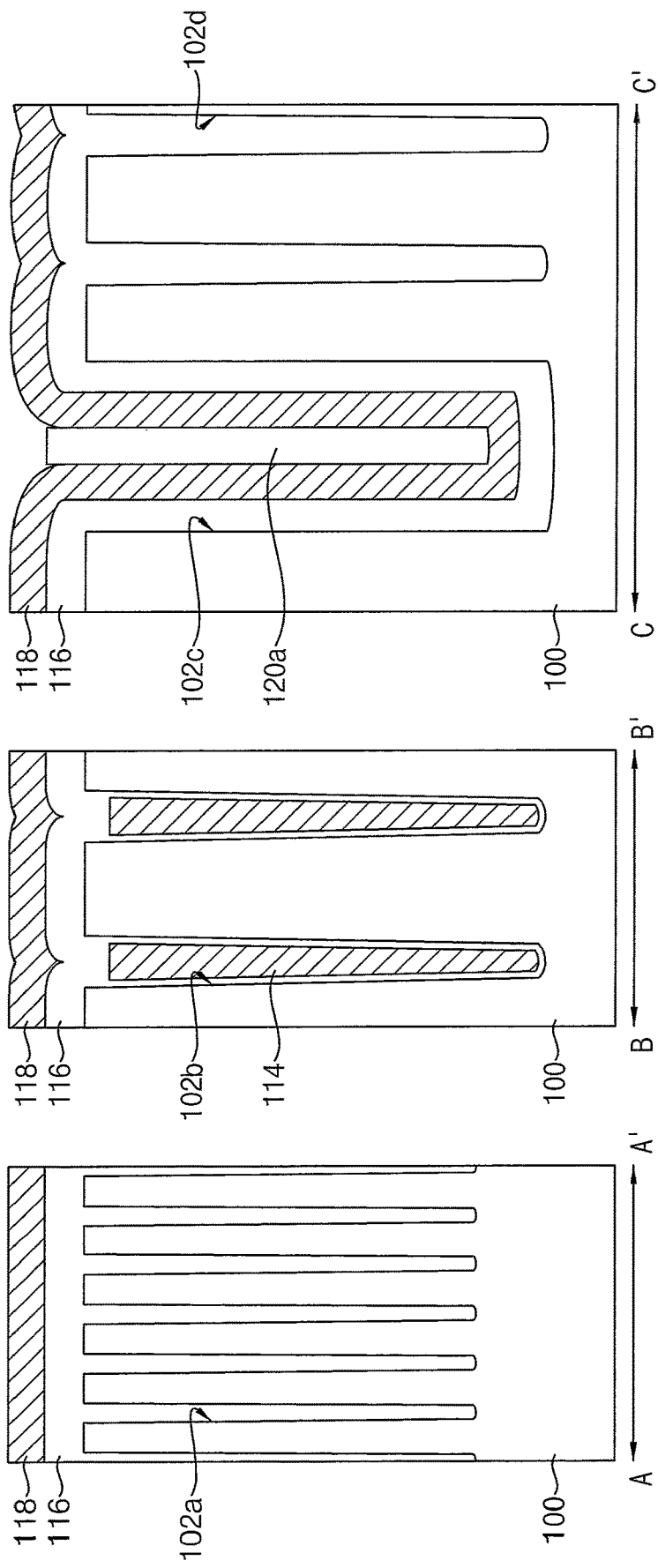

Referring to the exemplary embodiment of FIG. 7, the third buried insulation layer 120 may be planarized until the second buried insulation layer 118 is exposed. In an exemplary embodiment, the planarization process may be performed by a chemical mechanical polishing (CMP) process and/or an etch back process. However, exemplary embodiments of the present inventive concepts are not limited thereto.

As shown in the exemplary embodiment of FIG. 7, the third buried insulation layer 120 on the first region I may be completely removed by the planarization process, so that the second buried insulation layer 118 is exposed. However, the third buried insulation layer 120 formed in the third trench 102c of the second region II may remain. Therefore, the third buried insulation layer 120 remaining in the third trench 102c may form a third buried insulation layer pattern 120a. As shown in the exemplary embodiment of FIG. 7, an upper surface of the third buried insulation layer pattern 120a may be higher than the upper surface of the substrate 100.

Figure 8:
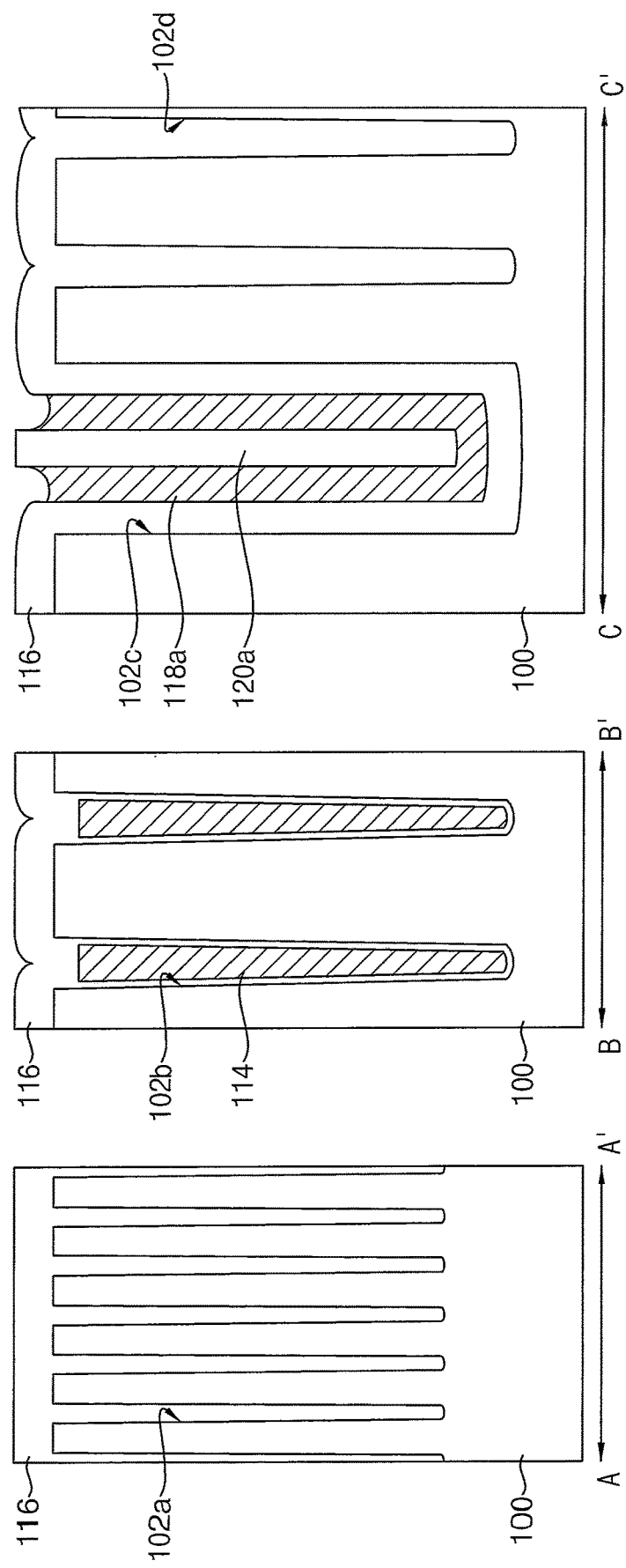

Referring to the exemplary embodiment of FIG. 8, an upper portion of the second buried insulation layer 118 may be removed until the first buried insulation layer 116 on the first region I may be exposed. In an exemplary embodiment, the removing process of the second buried insulation layer 118 may be performed by a wet etching or wet cleaning process. However, exemplary embodiments of the present inventive concepts are not limited thereto.

In this exemplary embodiment, the second buried insulation layer 118 on the first region I may be completely removed to expose the first buried insulation layer 116. However, the second buried insulation layer 118 formed in the third trench 102c of the second region II may remain after the removal process. Therefore, the second buried insulation layer 118 remaining in the third trench 102c may form a second buried insulation layer pattern 118a.

Therefore, as shown in the exemplary embodiment of FIG. 8, upper surfaces of the first buried insulation layer 116, the second buried insulation layer pattern 118a and the third buried insulation layer pattern 120a may be exposed in the second region II. The first buried insulation layer 116, the second buried insulation layer pattern 118a and the third buried insulation layer pattern 120a may be formed to substantially fill the third trench 102c of the second region II.

The first buried insulation layer 116 may be filled in the first trench 102a and the fourth trench 102d of the first region I. The first buried insulation layer 116 and the second insulation layer pattern 114 may be filled in the second trench 102b of the first region I.

When an etching process is performed to completely remove the second buried insulation layer 118 on the first region I, the second buried insulation layer 118 formed above the third trench 102c may also be partially removed. Therefore, in the third trench 102c, an upper surface of the second buried insulation layer pattern 118a may be lower than an upper surface of the third buried insulation layer pattern 120a. For example, as shown in the exemplary embodiment of FIG. 8, an upper portion of the third buried insulation layer pattern 120a may protrude from the upper surface of the second buried insulation layer pattern 118a.

In the second buried insulation layer 118 on the second region II, a portion contacting the third buried insulation layer pattern 120a may have a relatively low etch rate. Therefore, the second buried insulation layer pattern 118a on the second region II may remain more at the portion contacting the third buried insulation layer pattern 120a. Therefore, an upper surface of the second buried insulation layer pattern 118a may be higher the closer the surface is to the third buried insulation layer pattern 120a. For example, as shown in the exemplary embodiment of FIG. 8, an upper surface of the second buried insulation layer pattern 118a may have a non-flat shape, such as a concave shape in which lateral sides that are closest to the third buried insulation layer pattern 120a are higher than the remaining portions of the upper surface of the second buried insulation layer pattern 118a.

Figure 9:
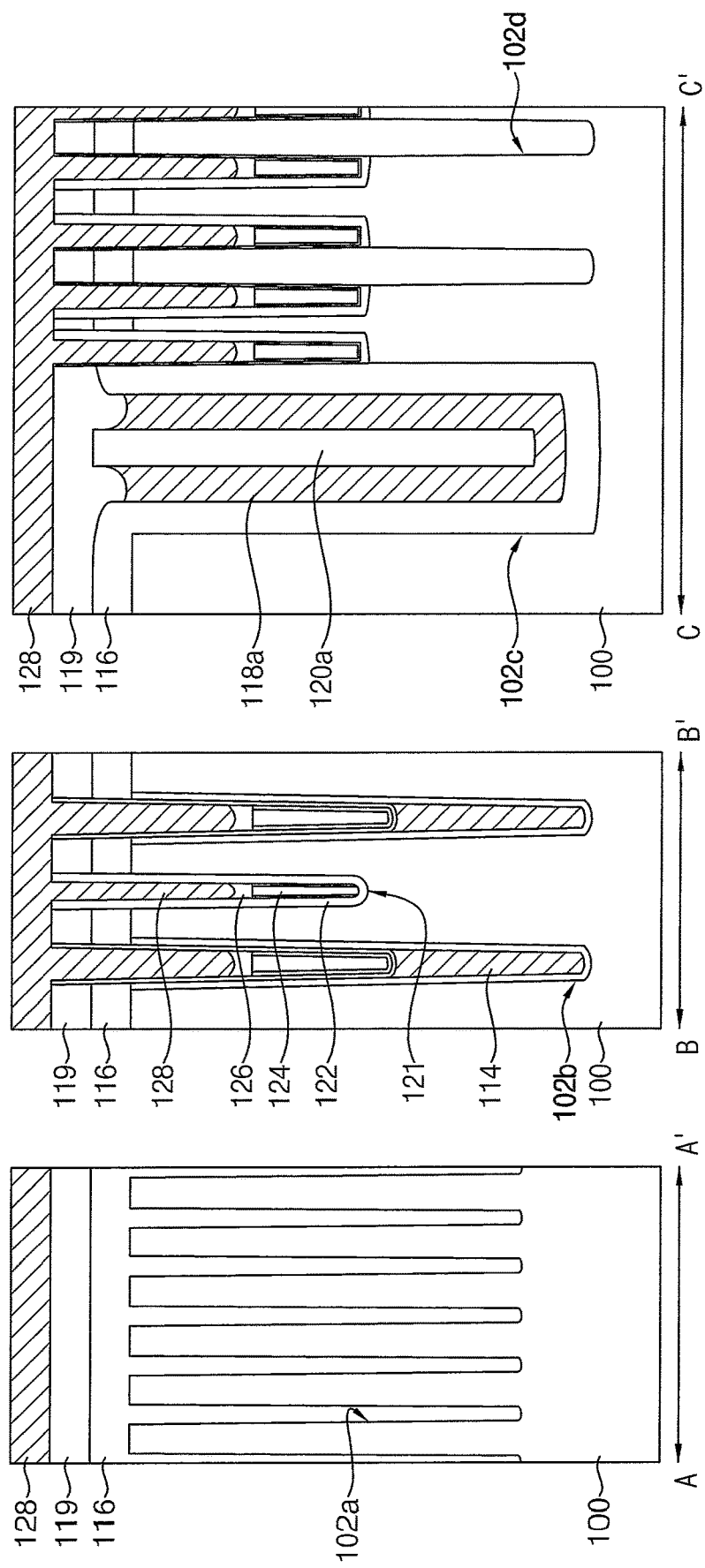

Referring to the exemplary embodiment of FIG. 9, a second mask pattern 119 may be formed on the first buried insulation layer 116 on the first region I, and the first buried insulation layer 116, the second buried insulation layer pattern 118a and the third buried layer pattern 120a on the second region II. In an exemplary embodiment, the second mask pattern 119 may include silicon oxide.

The second mask pattern 119 may be formed to expose portions of the first buried insulation layer 116 and the first active pattern 104 on the first region I. The second mask pattern 119 on the first region I may extend in the first direction. Further, the second mask pattern 119 may cover all of the first buried insulation layer 116 and the second and third buried insulation layer patterns 118a and 120a in the third trench 102c on the second region II.

The first buried insulation layer 116, the second insulation layer pattern 114, and the upper portion of the substrate 100 in the first region I may be etched using the second mask pattern 119 as an etch mask to form a gate trench 121 extending in the first direction.

A gate insulation layer 122 may be conformally formed on an inner surface of the gate trench 121, and a gate electrode layer may be formed on the gate insulation layer 122. Thereafter, the gate electrode layer may be etched back to form a gate electrode 124 at a lower portion of the gate trench 121. In an exemplary embodiment, the gate electrode 124 may include a barrier pattern 144a and a metal pattern. In an exemplary embodiment, a polysilicon pattern 126 may be further formed on the gate electrode 124.

Thereafter, the first capping layer 128 may be formed on the second mask pattern 119 in the first and second regions I and II. The first capping layer 128 may be formed above the polysilicon pattern 126 to completely fill the gate trench 121. In an exemplary embodiment, the first capping layer 128 may include silicon nitride.

Figure 10:
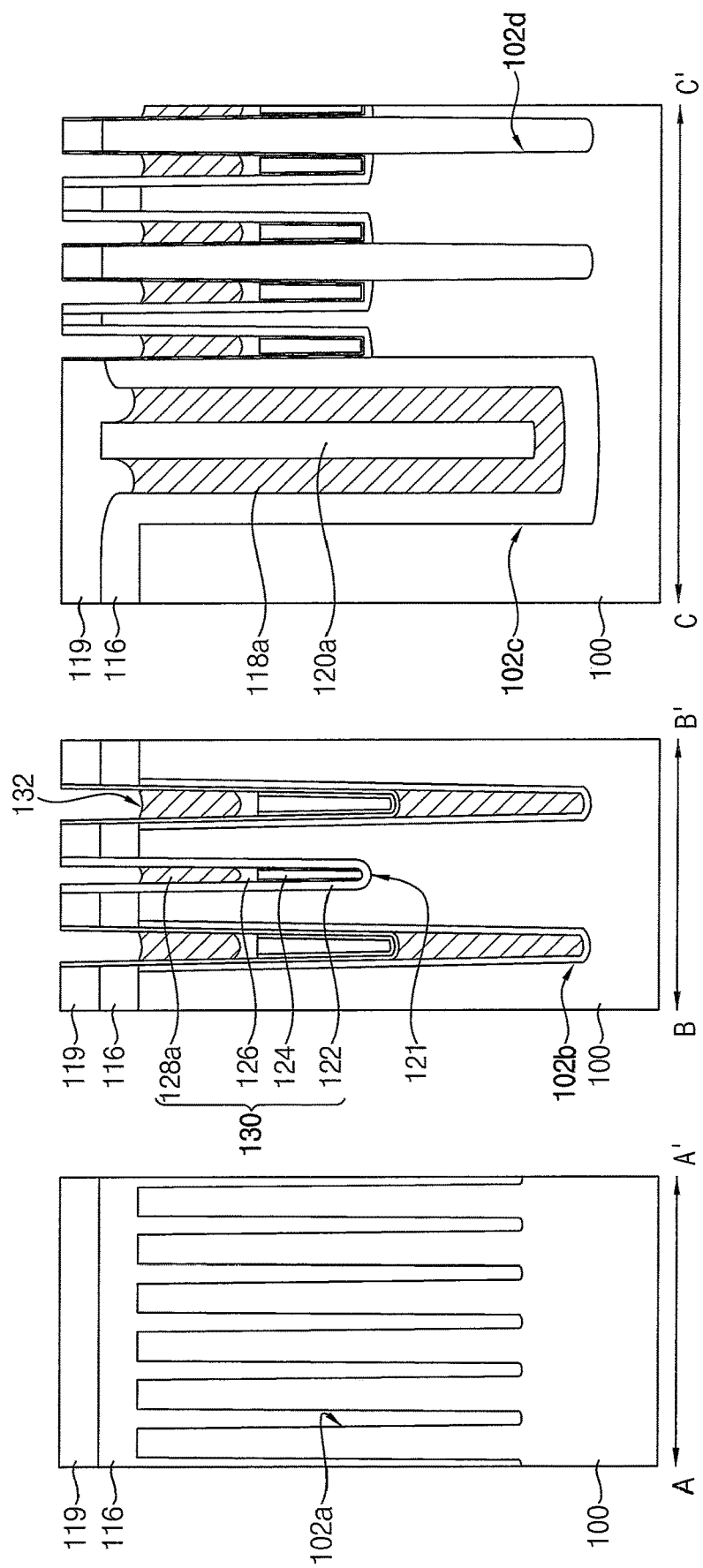
Figure 11:
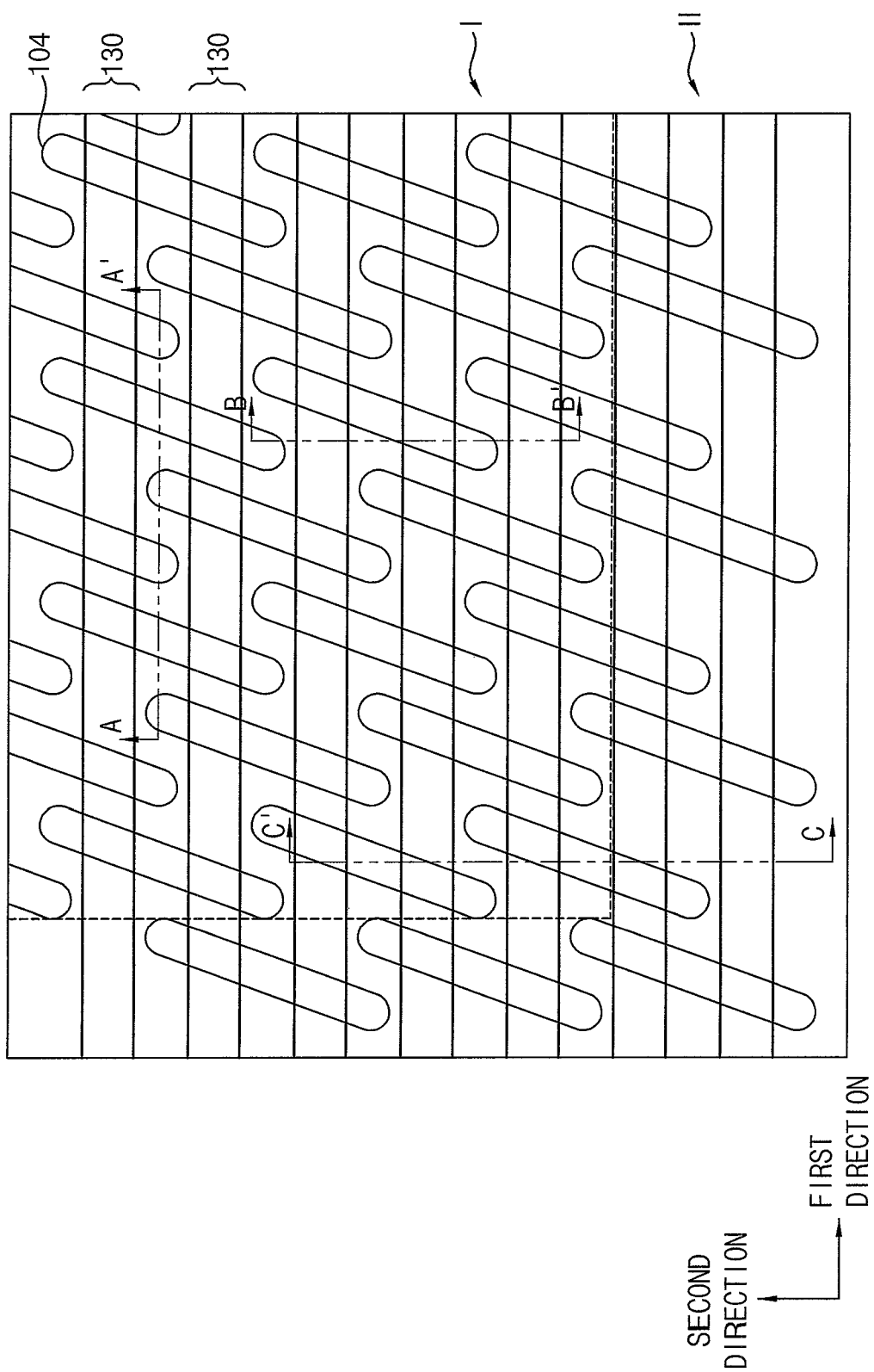

Referring to the exemplary embodiments of FIGS. 10 and 11, the first capping layer 128 may be etched back so that the first capping layer 128 may remain only in the gate trench 121. Therefore, a first capping layer pattern 128a may be formed in the gate trench 121. As shown in the exemplary embodiment of FIG. 10, an upper surface of the first capping layer pattern 128a may have a substantially same level as a level of an upper surface of the first active pattern 104.

In the etch back process, it may be difficult to provide a uniform etching of the first capping layer 128 in the gate trench 121. In general, an etching rate of a portion of the first capping layer 128 closer to the second mask pattern 119 may be lower than the etching rate of the remaining portions of the first capping layer 128. Therefore, an upper surface of the first capping layer pattern 128a formed over the gate trench 121 may not be flat, and may include a recess or a dimple portion 132 (hereinafter, a dimple portion). For example, as shown in the exemplary embodiment of FIG. 10, the upper surface of the first capping layer pattern 128a may have a generally concave shape with a dimple portion 132 positioned in a central portion of the upper surface of the first capping layer pattern 128a.

The first capping layer pattern 128a on the first region I may have a line shape extending in the first direction, and a plurality of first capping layer patterns 128a may be arranged in the second direction. Therefore, the dimple portions 132 may be disposed on an entire upper portion of the substrate 100 in the first direction and an upper surface of a layer formed on the upper portion of the substrate 100 may not be uniform.

As shown in the exemplary embodiments of FIGS. 10-11, by performing the above processes, a gate structure 130 including the gate insulation layer 122, the gate electrode 124, the polysilicon pattern 126 and the first capping layer pattern 128a may be formed in the gate trench 121 and a plurality of gate structures 130 may be arranged in the second direction.

Figure 12:
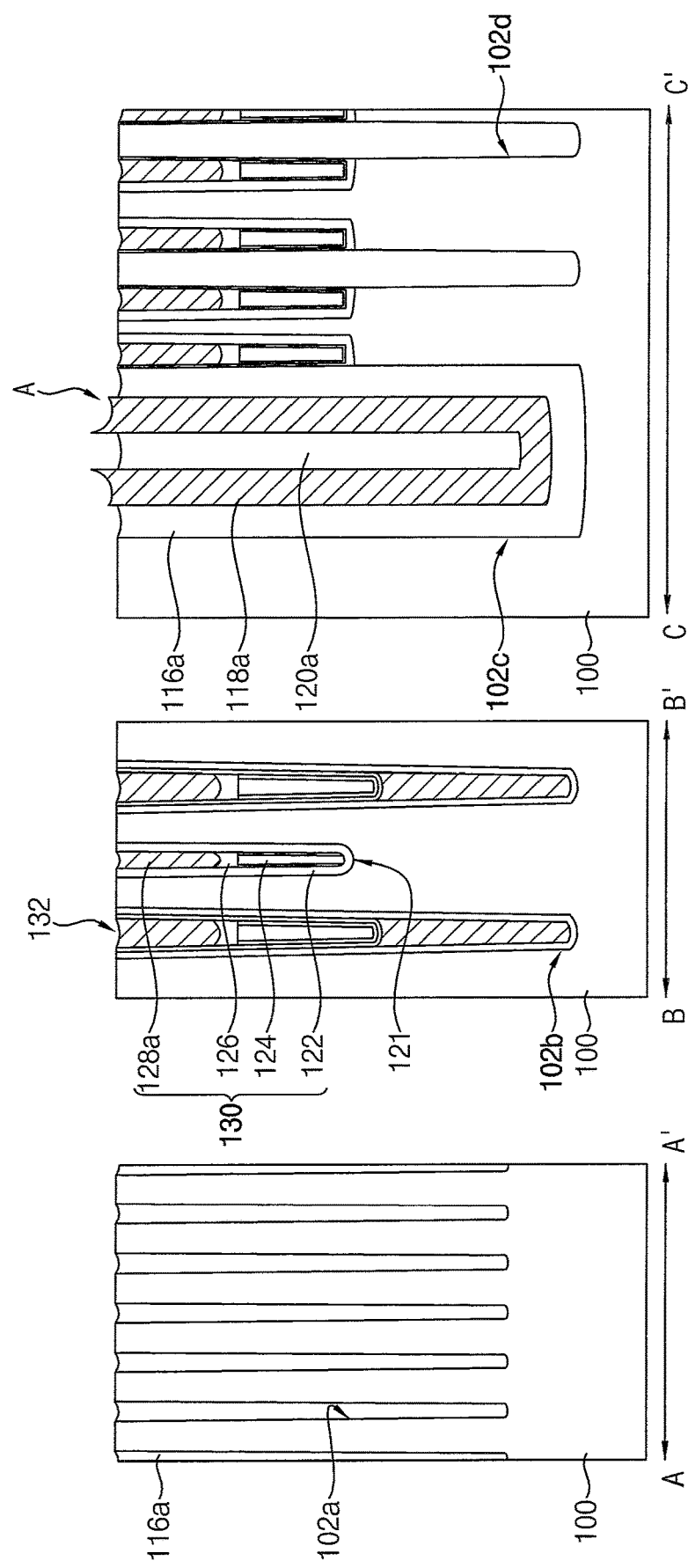

Referring to the exemplary embodiment of FIG. 12, the second mask pattern 119 may be removed in the first and second regions I, II. Subsequently, an upper portion of the first buried insulation layer 116 may be partially removed until the upper surface of the substrate 100 in the first region I is exposed. In an exemplary embodiment, the removing process may include a wet etching or a wet cleaning process. However, exemplary embodiments of the present inventive concepts are not limited thereto.

When the removing process is performed, an upper surface of the first active pattern 104 may be exposed at the first region I. The first buried insulation layer 116 on the substrate 100 may be etched to form a first buried insulation layer pattern 116a in the first trench 102a and the fourth trench 102d.

In the removing process of the second mask pattern 119, the same material as the second mask pattern 19 (e.g., layers including silicon oxide) may be removed together. Therefore, an upper portion of the third buried insulation layer pattern 120a formed in the third trench 102c of the second region II may also be partially removed. The second buried insulation layer pattern 118a in the third trench 102c may have a greater height than the third buried insulation layer pattern 120a and may protrude from the third buried insulation layer pattern 120a. A portion of the second buried insulation layer pattern 118a protruding from the first and third buried insulation layer patterns 116a and 120a is referred to as a protrusion A.

When the above process is performed, upper surfaces of the substrate 100, the first buried insulation layer pattern 116a, and the first capping layer pattern 128a may be exposed in the first region I. In addition, upper surfaces of the substrate 100 and the first to third buried insulation layer patterns 116a, 118a, and 120a in the fourth trenches 102d may be exposed in the second region II. In an exemplary embodiment, a portion of the insulation layer may remain on the substrate 100 of the second region II.

When the cleaning process is performed, the exposed upper surface of the first buried insulation layer pattern 116a in the first to fourth trenches 102a, 102b, 102c, and 102d may not be flat. For example, in an exemplary embodiment, the exposed upper surface of the first buried insulation layer pattern 116a may have a dimple portion and may have a generally concave shape.

Figure 13:
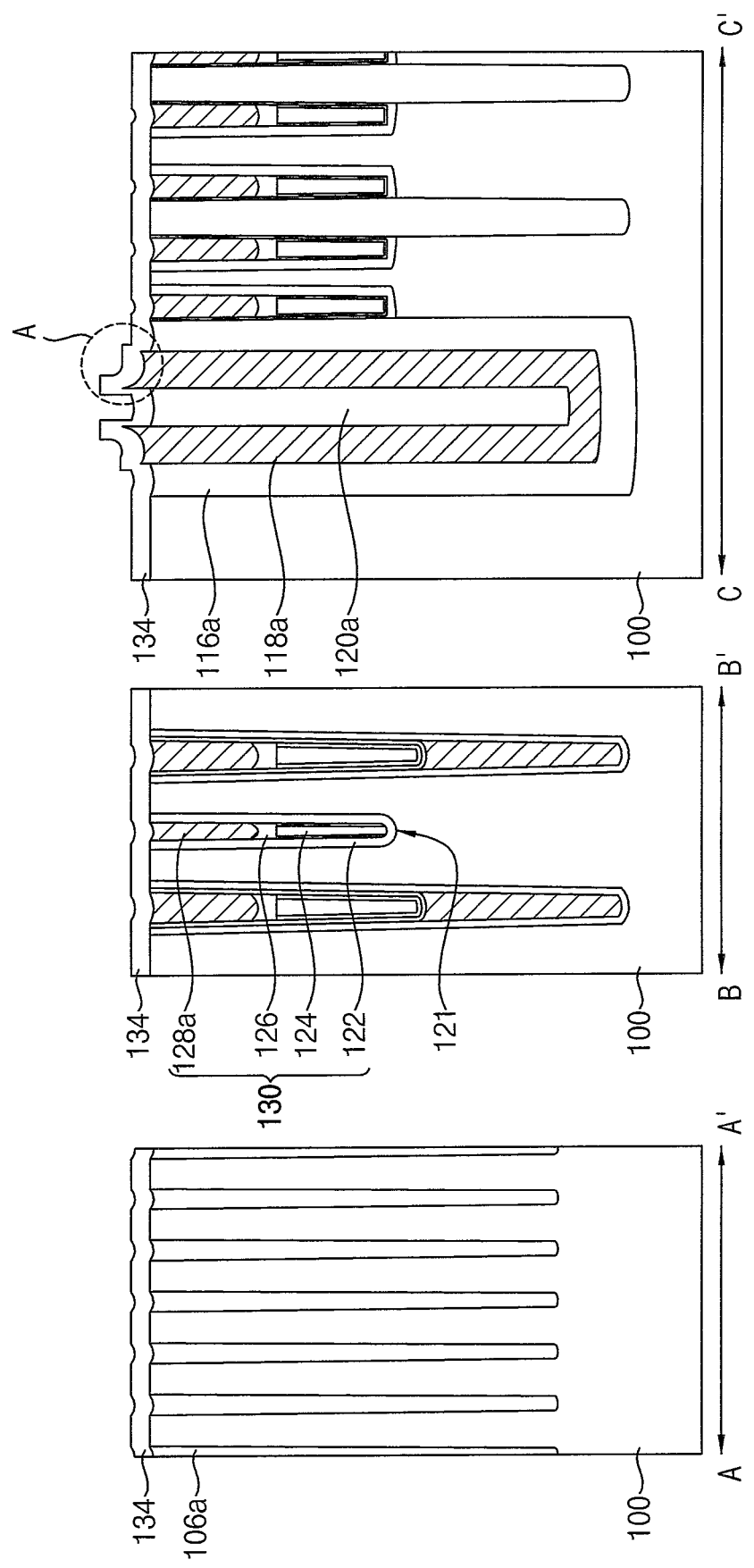

Referring to the exemplary embodiment of FIG. 13, a preliminary first buffer insulation layer 134 is formed on the upper surfaces of the substrate 100, the first buried insulation layer pattern 116a, and the first capping layer pattern 128a in the first region I, and the upper surfaces of the substrate 100 and the first to third buried insulation layer patterns 116a, 118a, and 120a in the second region II. The preliminary first buffer insulation layer 134 may be formed to insulate conductive patterns (e.g., bit lines or contacts) formed on upper and lower portions. In an exemplary embodiment, the preliminary first buffer insulation layer 134 may include silicon oxide. In an exemplary embodiment, the preliminary first buffer insulation layer 134 may be formed by an atomic layer deposition (ALD) process.

In an exemplary embodiment, the preliminary first buffer insulation layer 134 may have a thickness of about 1.5 to about 3 times of a target thickness of a first buffer insulation layer subsequently formed. If the thickness of the preliminary first buffer insulation layer 134 is less than about 1.5 times of the target thickness of the first buffer insulation layer, a polishing thickness of the preliminary first buffer insulation layer 134 may be decreased in a planarization process. Therefore, the planarization process may be difficult to control so that the buffer insulation layer may have the target thickness. If the thickness of the preliminary first buffer insulation layer 134 is greater than about 3 times of the target thickness of first buffer insulation layer, the polishing thickness of the preliminary first buffer insulation layer 134 may be increased in the planarization process. Therefore, the planarization process may be difficult to control. In an exemplary embodiment, the thickness of the preliminary first buffer insulation layer 134 may be greater than the target thickness of the first buffer insulation layer in a range of about 20 Å to about 150 Å.

In an exemplary embodiment, the thickness of the preliminary first buffer insulation layer 134 may be in range of about 70 Å to about 200 Å.

The preliminary first buffer insulation layer 134 may have a non-uniform thickness at the dimple portion 132 of the upper surface of the first capping layer pattern 128a. The dimple portion 132 may be transferred to an upper surface of the preliminary first buffer insulation layer 134 and a dimple portion may be formed in the portion of the upper surface of the preliminary first buffer insulation layer 134 overlapping the dimple portion 132 of the upper surface of the first capping layer pattern 128a. Therefore, an upper surface and a lower surface of the preliminary first buffer insulation layer 134 formed on the first capping layer pattern 128a may not be uniform.

Further, the upper surface of the first buried insulation layer pattern 116a on the first region I may not be flat, and thus an upper surface and a lower surface of the preliminary first buffer insulation layer 134 formed on the first buried insulation layer pattern 16a may not be uniform.

As described above, a surface of a layer under the preliminary first buffer insulation layer 134 in the first region I may not be uniform, so that the morphology of the upper surface of the preliminary first buffer insulation layer 134 may not be uniform.

The preliminary first buffer insulation layer 134 may be conformally formed on the protrusion A in the second region II, so that the upper surface of the preliminary first buffer insulation layer 134 formed on the protrusion A may be relatively high as compared to other portions of the upper surface of the preliminary first buffer insulation layer 134.

Figure 14:
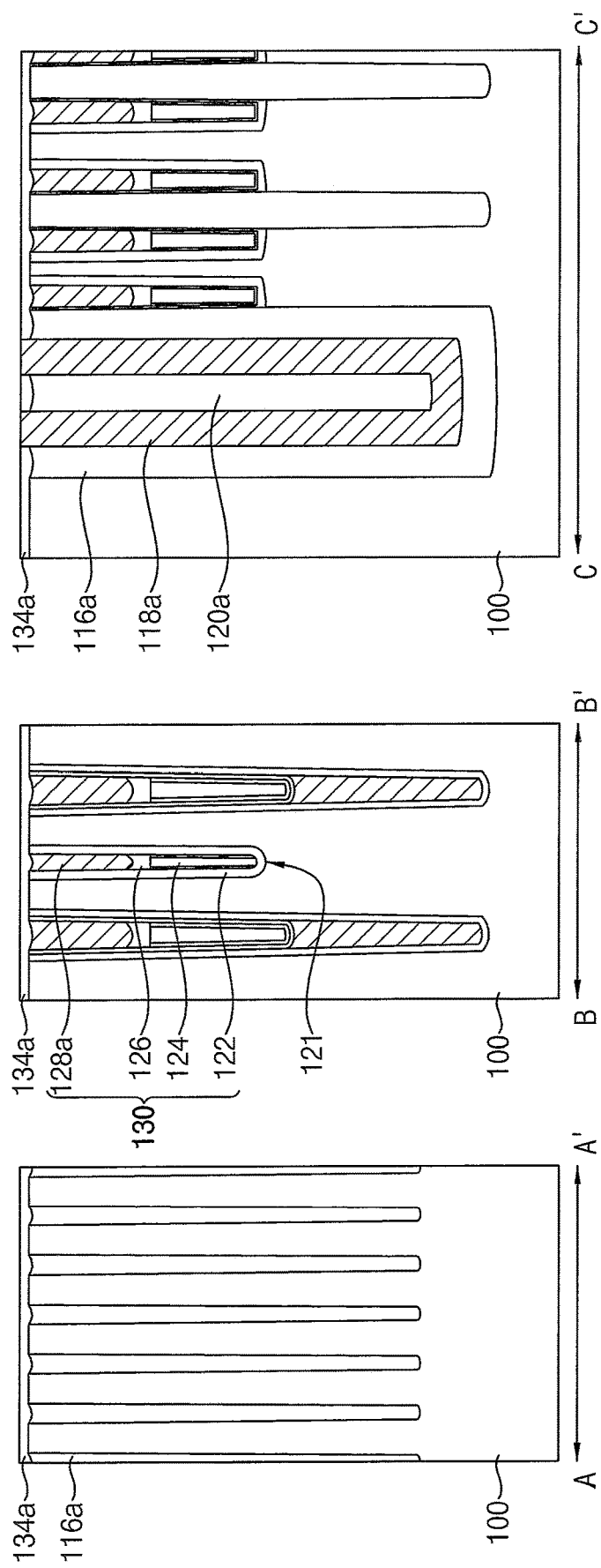

Referring to the exemplary embodiment of FIG. 14, an upper portion of the preliminary first buffer insulation layer 134 may be planarized to form a first buffer insulation layer 134a having a thickness that is less than the thickness of the preliminary first buffer insulation layer 134. For example, the first buffer insulation layer 134a may have a thickness equal to the target thickness. An upper surface of the first buffer insulation layer 134a may be substantially flat by the planarization process.

In an exemplary embodiment, the thickness of the first buffer insulation layer 134a may be in range of about 35 Å to about 100 Å. In an exemplary embodiment, the planarization process may include a chemical mechanical polishing (CMP) process.

A flatness of an upper surface of the first buffer insulation layer 134a may be different from a flatness of a lower surface of the first buffer insulation layer 134a. The lower surface of the first buffer insulation layer 134a may have a poor flatness due to non-uniformity of an underlying layer. However, the upper surface of the first buffer insulation layer 134a may be flatter than the lower surface of the first buffer insulation layer 134a by the planarization process. For example, the upper surface of the first buffer insulation layer 134a may be substantially flat and has a flatness that is greater than the flatness of the lower surface of the first buffer insulation layer 134a.

The protrusion A may be removed during the planarization (e.g., a polishing) of the preliminary first buffer insulation layer 134 on the second region II. For example, the preliminary first buffer insulation layer 134 formed on the protrusion A may be removed, and the protrusion A of the second buried insulation layer pattern 118a may be removed. Therefore, first buffer insulation layers 134a may be formed on upper sidewalls of the second buried insulation layer pattern 118a. The first buffer insulation layers 134a may be separated by (e.g., spaced apart in the second direction by) the second buried insulation layer pattern 118a. By removing the protrusion A, upper surfaces of the first buffer insulation layer 134a and the second buried insulation layer pattern 118a may be substantially coplanar with each other. For example, upper surfaces of the first buffer insulation layer 134a and the second buried insulation layer pattern 118a may have a same height.

As described above, a step difference between the layers formed on the first and second regions I and II may be decreased by the planarization process and upper surfaces of the layers may be substantially flat.

Figure 15:
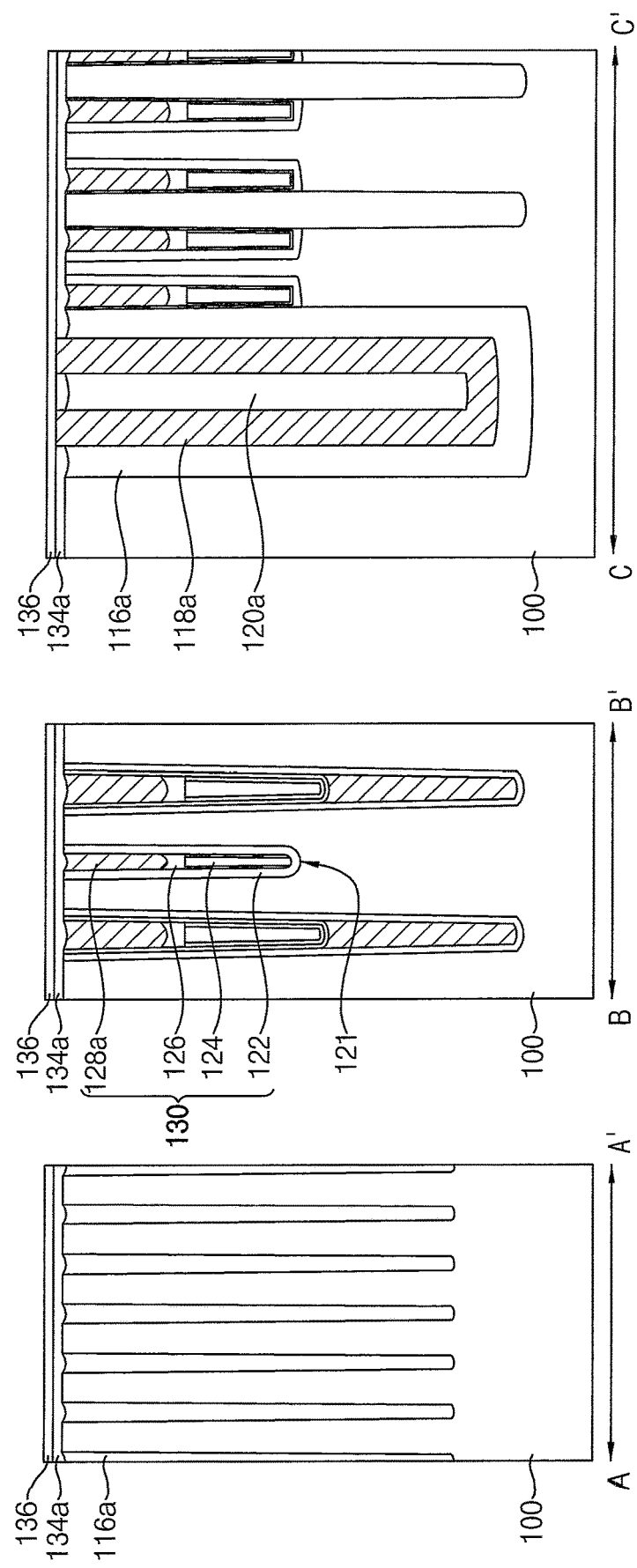

Referring to the exemplary embodiments of FIG. 15, a second buffer insulation layer 136 may be formed on the first buffer insulation layer 134a.

In an exemplary embodiment, the second buffer insulation layer 136 may serve as an etch stop layer. However, exemplary embodiments of the present inventive concepts are not limited thereto. The second buffer insulation layer 136 may include an insulation material having a high etch selectivity with respect to silicon oxide. In an exemplary embodiment, the second buffer insulation layer 136 may include silicon nitride. For example, the second buffer insulation layer 136 may be formed by an ALD process. However, exemplary embodiments of the present inventive concepts are not limited thereto. In an exemplary embodiment, a thickness range of the second buffer insulation layer 136 may be the same as the target thickness range of the first buffer insulation layer 134a. For example, the second buffer insulation layer 136 may have a thickness in a range of about 35 Å to about 100 Å.

In an exemplary embodiment, a third buffer insulation layer may be further formed on the second buffer insulation layer 136. In an exemplary embodiment, the third buffer insulation layer may include silicon oxide. However, exemplary embodiments of the present inventive concepts are not limited thereto and in some exemplary embodiments, a third buffer insulation layer may not be formed on the second buffer insulation layer 136.

The upper surface of the first buffer insulation layer 134a may be substantially flat, and thus upper and lower surfaces of the second buffer insulation layer 136 formed on the first buffer insulation layer 134a may be substantially flat. In an exemplary embodiment that includes a third buffer insulation layer, upper and lower surfaces of the third buffer insulation layer may also be substantially flat.

The second buffer insulation layer 136 on the second region may be formed on the first buffer insulation layer 134a and the second buried insulation layer pattern 118a.

Figure 16:
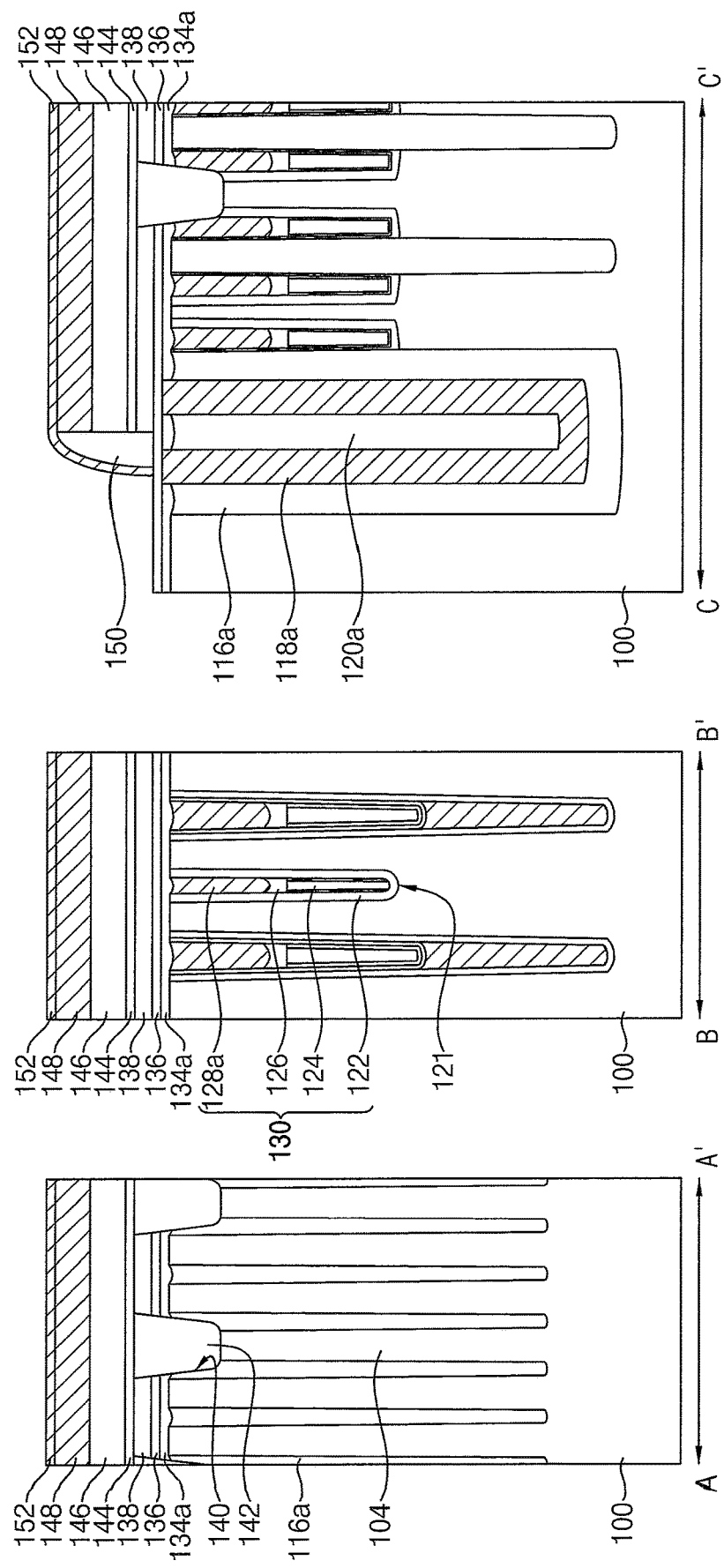
Figure 17:
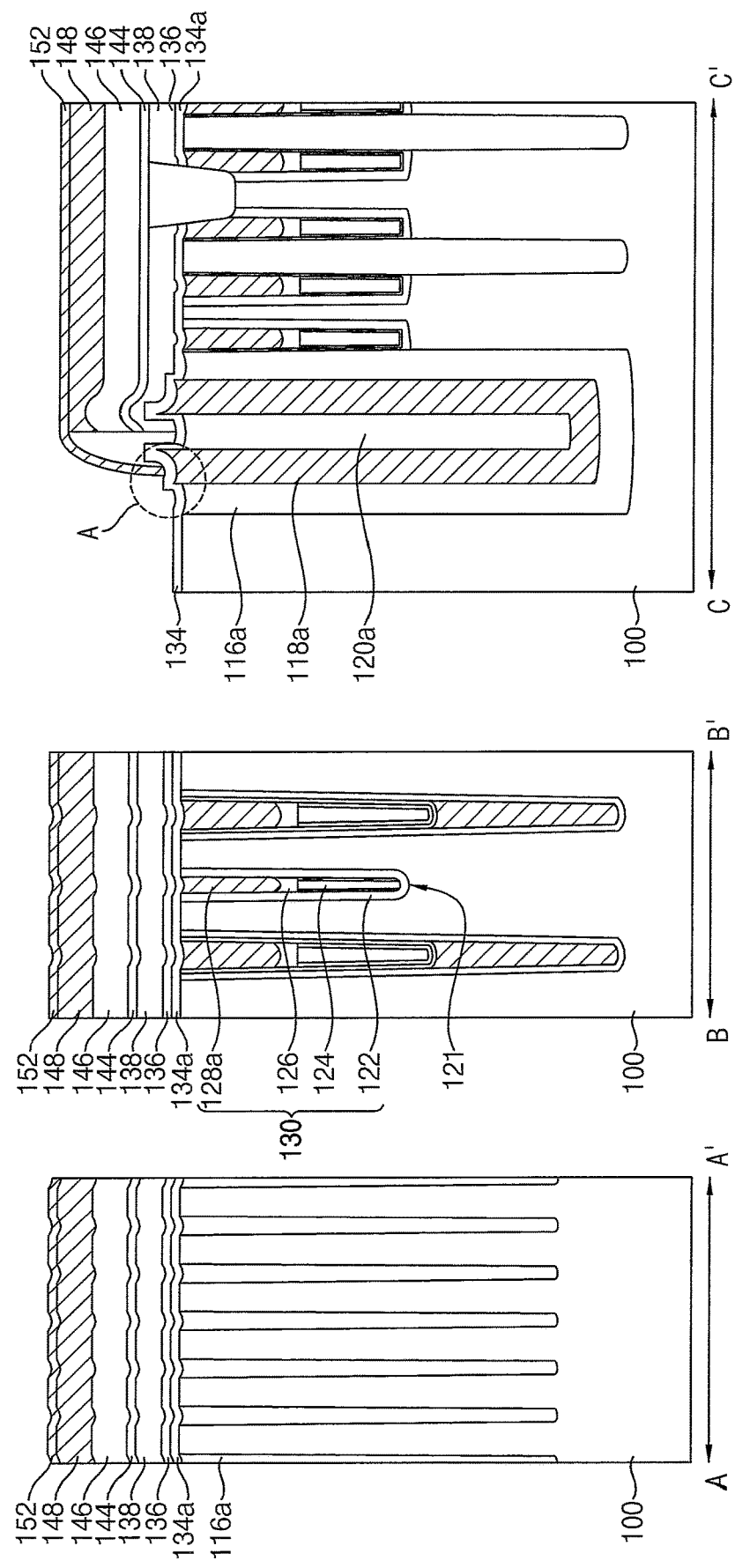

Referring to the exemplary embodiment of FIG. 16, a first conductive layer 138 may be formed on the second buffer insulation layer 136. A third mask pattern may be formed on the first conductive layer 138. The first conductive layer 138, the second buffer insulation layer 136 and the first buffer insulation layer 134a may be etched using the third mask pattern as an etch mask to form a first opening 140 exposing an upper portion of the first active pattern 104.

In the etching process, an upper portion of the substrate 100 exposed by the first opening 140 and the buried insulation layer patterns and the first capping layer pattern 128a adjacent to the substrate 100 may also be etched to form a recess. A bottom of the first opening 140 may also be referred to as the recess. In an exemplary embodiment, the first opening 140 may expose a center portion of an upper surface of the first active patterns 104 in the first region I.

A second conductive layer 142 may be formed to fill the first opening 140.

In an exemplary embodiment, a preliminary second conductive layer may be formed to fill the first opening 140, and an upper portion of the preliminary second conductive layer may subsequently be etched back. Therefore, an upper surface of the second conductive layer 142 and an upper surface of the first conductive layer 138 may have substantially the same height.

In an exemplary embodiment, the first and second conductive layers 138 and 142 may include polysilicon doped with impurities, and the first and second conductive layers 138 and 142 may be merged with each other.

After removing the third mask pattern, a barrier layer 144, a first metal layer 146, and a second capping layer 148 may be sequentially formed on the first and second conductive layers 138 and 142.

Thereafter, the second capping layer 148, the first metal layer 146, the barrier layer 144, and the first and second conductive layers 138 and 142 may be sequentially etched to form a preliminary bit line structure in the first region I and the second region II.

A spacer 150 may be formed on a sidewall of the preliminary bit line structure, and a nitride liner 152 may be further formed on the spacer 150 and an upper surface of the preliminary bit line structure. In an exemplary embodiment, the nitride liner 152 may include silicon nitride.

By removing the protrusion A on the substrate 100 of the second region II, the first conductive layer 138 may be formed to have a substantially flat upper surface and a substantially flat lower surface. Therefore, the barrier layer 144 and the first metal layer 146 formed on the first conductive layer 138 on the second region II may also be formed to have substantially flat upper surfaces and substantially flat lower surfaces.

Unlike an exemplary embodiment of the present inventive concepts in the comparative example in which the protrusion A remains on the second region II shown in FIG. 17, the barrier layer 144 and the first metal layer 146 formed on the first conductive layer 138 on the second region II may be conformally formed along a profile of the protrusion A. Therefore, the upper surfaces of the barrier layer 144 and the first metal layer 146 formed on the first conductive layer 138 may also not be uniform. Therefore, the non-uniform surfaces in this comparative example may cause defects in a bit line structure subsequently formed thereon.

Figure 18:
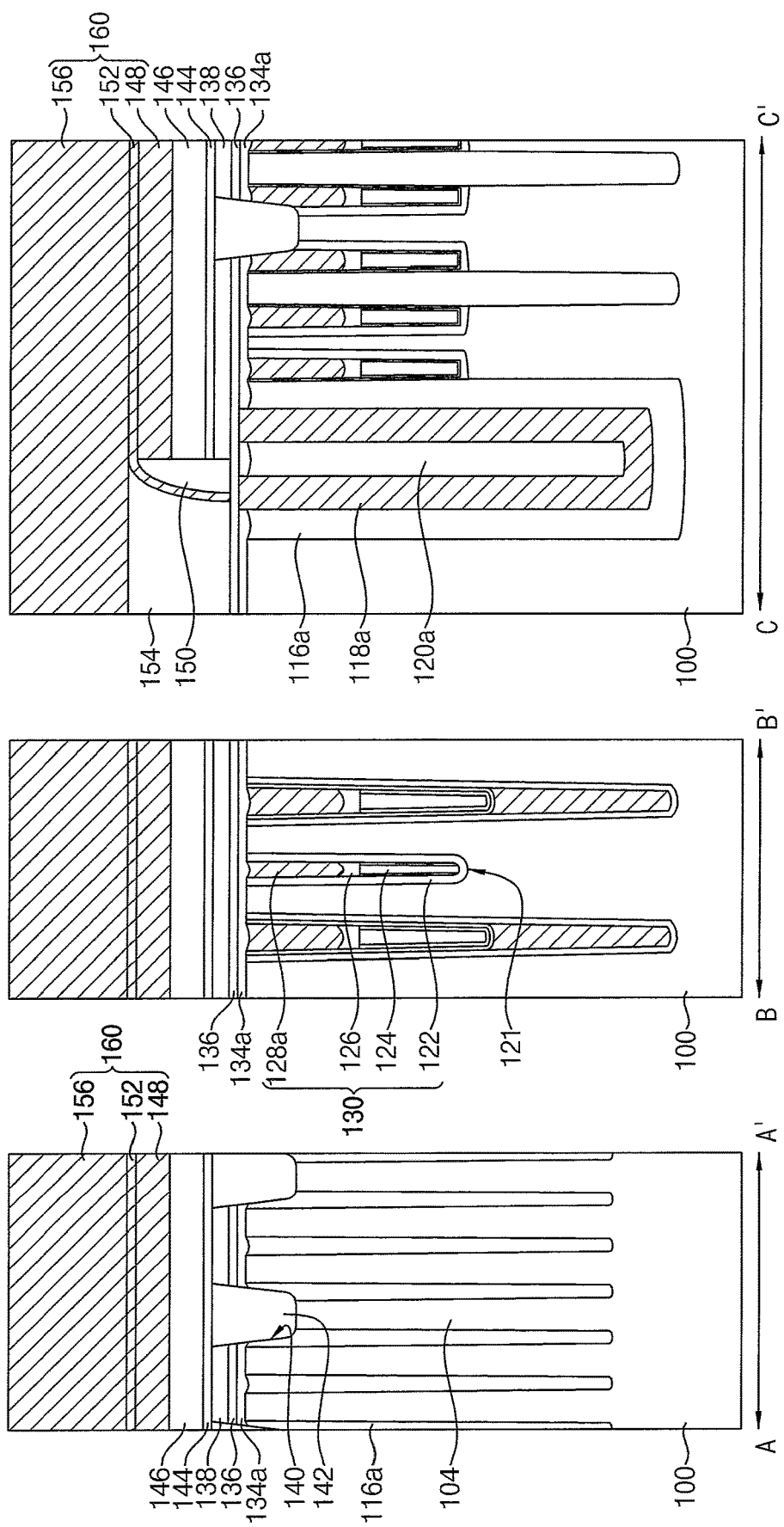

Referring to the exemplary embodiment of FIG. 18, a lower insulating interlayer pattern 154 may be formed on the second buffer insulation layer 136 on the second region II.

A third capping layer 156 may be formed on the nitride liner 152 and the lower insulating interlayer pattern 154. In an exemplary embodiment, the third capping layer 156 may include silicon nitride. The second capping layer 148, the nitride liner 152, and the third capping layer 156 may include silicon nitride, and thus the second capping layer 148, the nitride liner 152, and the third capping layer 156 may be merged with each other. Hereinafter, a merged structure including the second capping layer 148, the nitride liner 152, and the third capping layer 156 is referred to as an upper capping layer 160.

Figure 19:
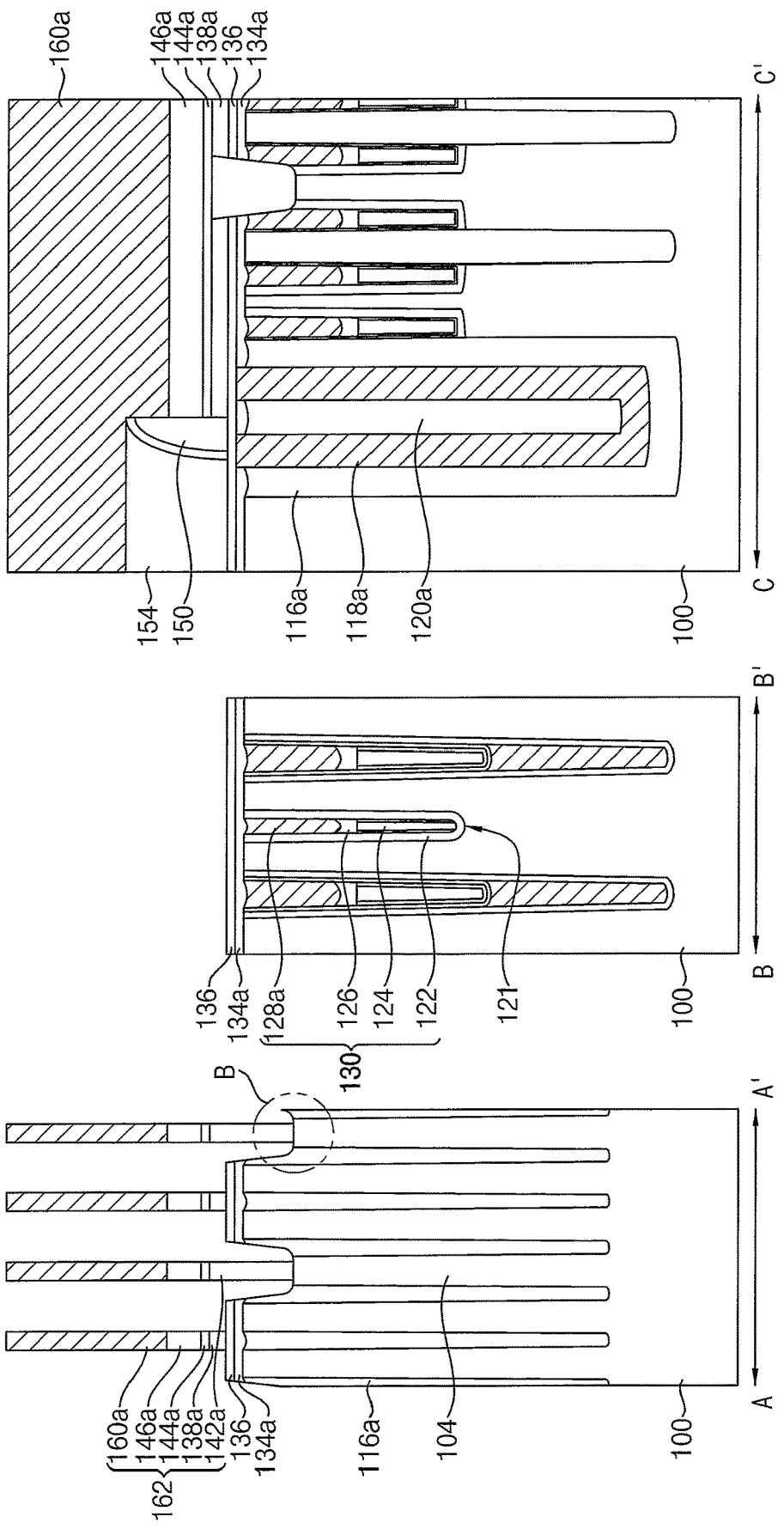
Figure 20:
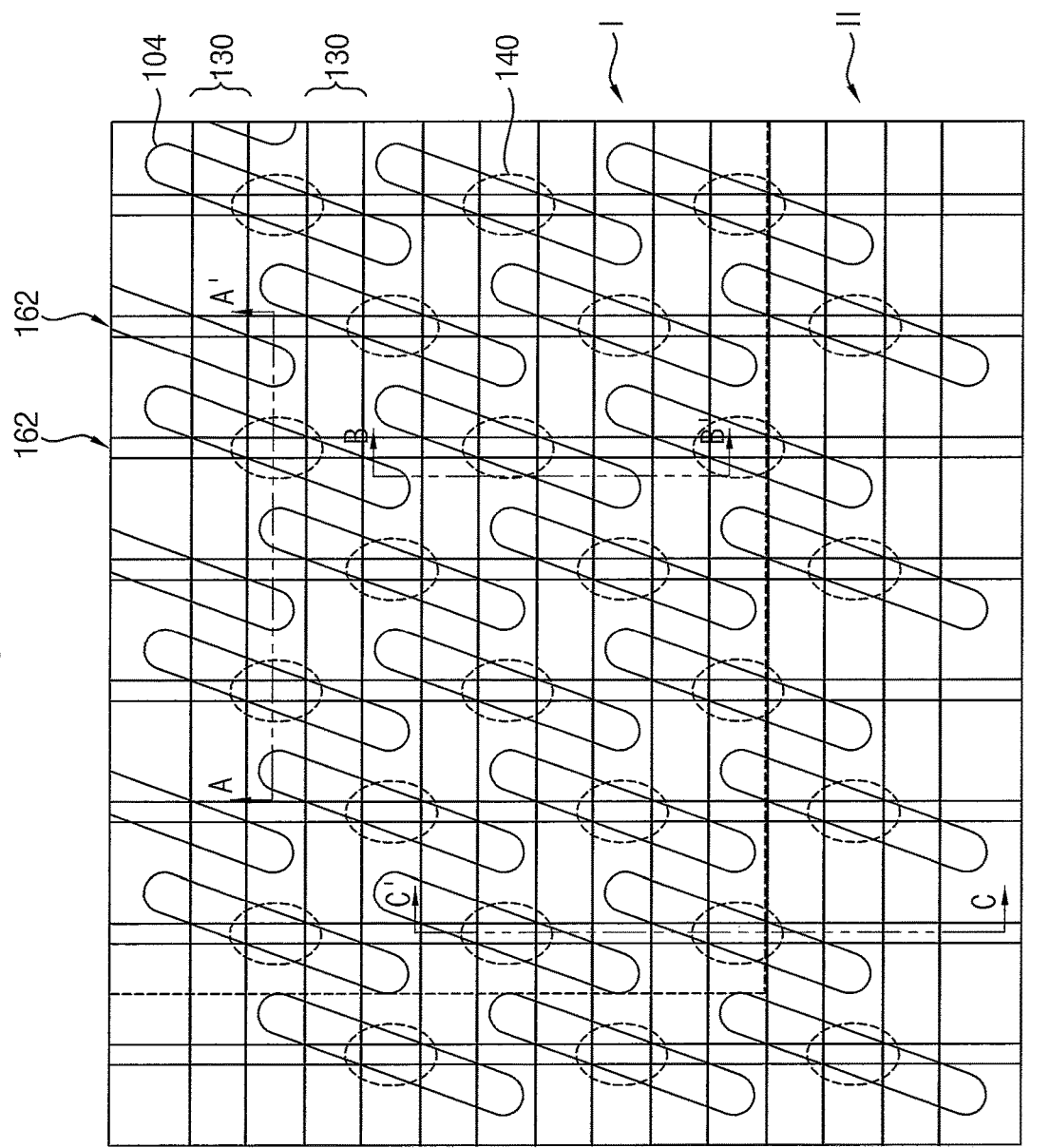

Referring to the exemplary embodiments of FIGS. 19 and 20, the upper capping layer 160 may be etched to form an upper capping layer pattern 160a. The first metal layer 146, the barrier layer 144 and the first and second conductive layers 138 and 142 may be sequentially etched using the upper capping pattern as an etch mask.

Therefore, the second conductive pattern 142a, the barrier pattern 144a, the first metal pattern 146a, and the upper capping layer pattern 160a may be sequentially formed on the first active pattern 104 in the first opening 140. Additionally, as shown in the exemplary embodiment of FIG. 19, the first conductive pattern 138a, the barrier pattern 144a, the first metal pattern 146a, and the upper capping layer pattern 160a may be sequentially formed on the second buffer insulation layer 136 outside the first opening 140.

As described above, the first and second conductive layers 138 and 142 may be merged with each other, and thus the first and second conductive layers 138 and 142 may serve as a conductive pattern. As shown in the exemplary embodiments of FIGS. 19-20, the conductive pattern, the barrier pattern 144a, the first metal pattern 146a, and the upper capping layer pattern 160a sequentially stacked may provide the bit line structure 162.

In an exemplary embodiment, the bit line structure 162 may extend in the second direction, and a plurality of bit line structures may be arranged in the first direction. For example, as shown in the exemplary embodiment of FIG. 19, a first portion of the bit line structure 162 may have a lower surface that is formed on the second buffer insulation layer 136. A second portion of the bit line structure 162 may have a lower surface that is formed on an upper surface of the first active pattern 104. For example, as shown in portion B of the exemplary embodiment of FIG. 19, the second portion of the bit line structure 162 extending in the second direction may contact a surface of the first active pattern 104 exposed by the first openings.

Figure 21:
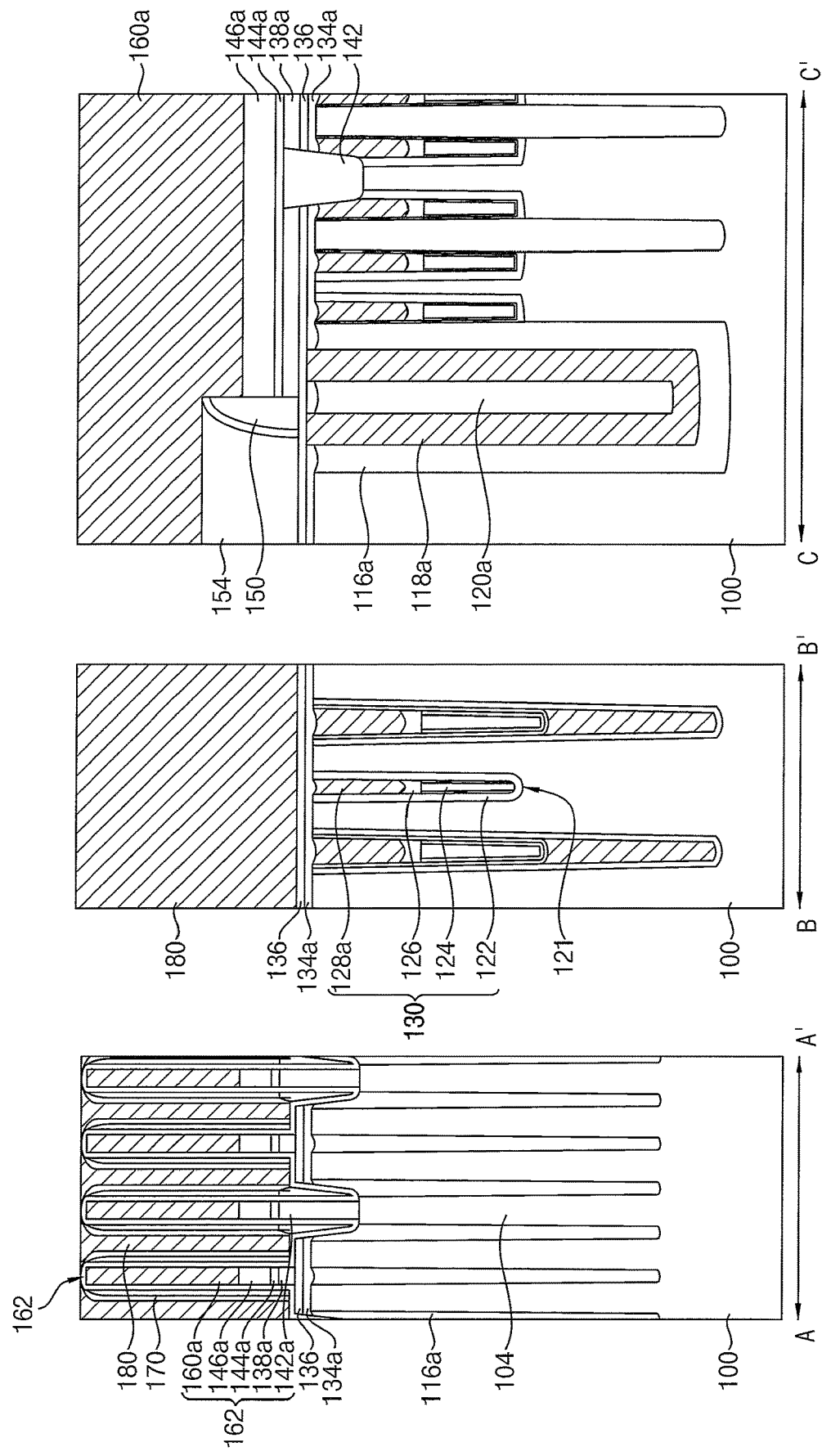

Referring to the exemplary embodiment of FIG. 21, a spacer structure 170 may be formed to cover a sidewall of the bit line structure 162.

As shown in the exemplary embodiment of FIG. 23, the spacer structure 170 may include a first spacer 170a covering lateral sidewalls and an upper surface of the bit line structure 162, a second spacer 170b filling the first opening 140, and third and fourth spacers 170c and 170d sequentially stacked (e.g., in the first direction) on the first spacer 170a to cover sidewalls of the bit line structure 162.

As shown in the exemplary embodiment of FIG. 21, a first insulating interlayer 180 may then be formed on the second buffer insulation layer 136 to fill a gap between the spacer structures 170. The first insulating interlayer 180 may be planarized until an upper surface of the spacer structure 170 may be exposed. In an exemplary embodiment, the first insulating interlayer 180 may include silicon oxide.

Figure 22:
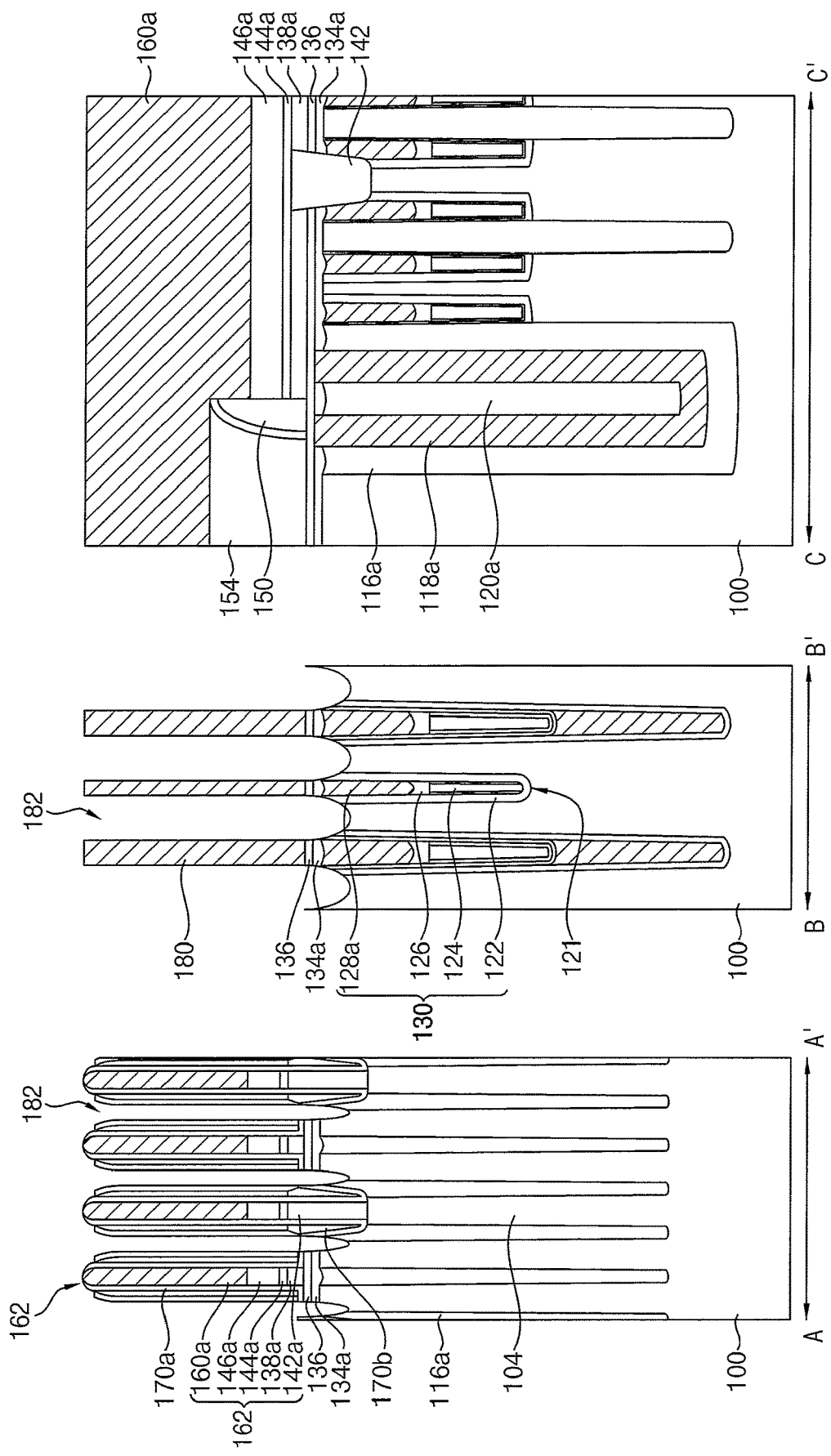
Figure 23:
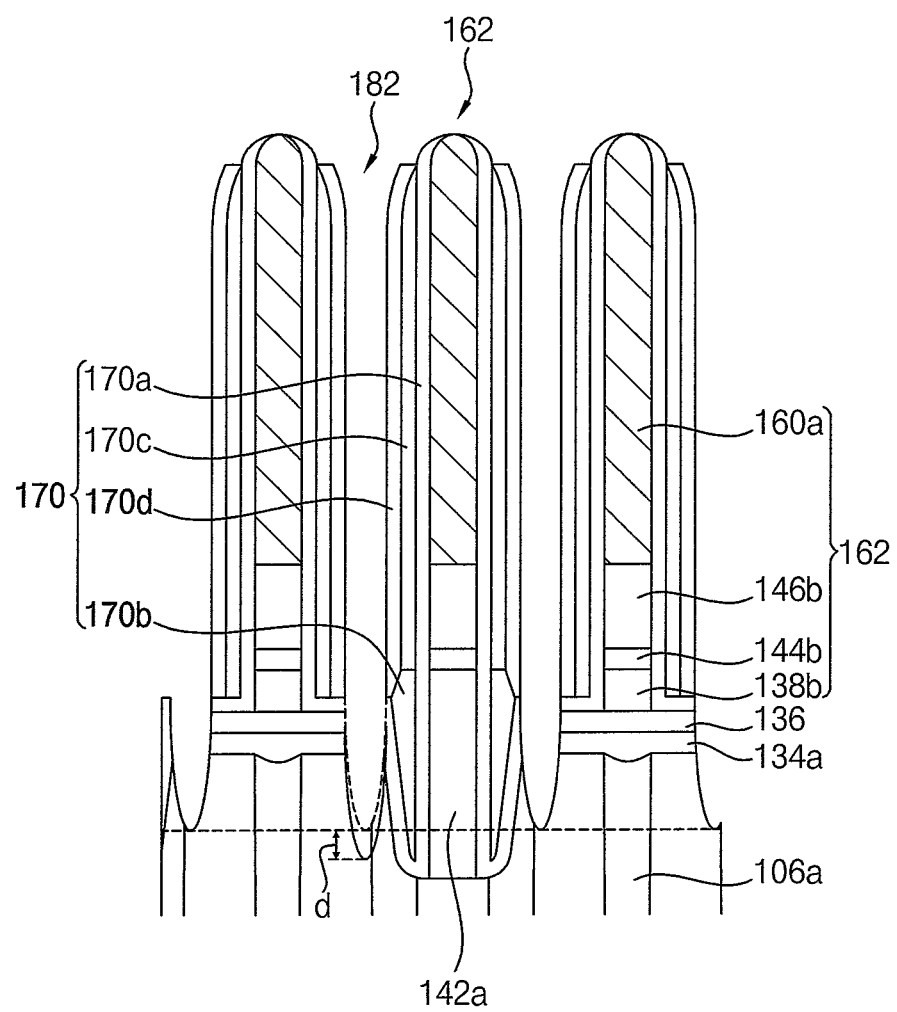

Referring to the exemplary embodiments of FIGS. 22 and 23, a fourth mask pattern may be formed on the first insulating interlayer 180 and the spacer structure 170. The first insulating interlayer 180 may be etched using the fourth mask pattern as an etch mask to form a second opening.

In an exemplary embodiment, the fourth mask pattern may extend in the first direction, and a plurality of fourth mask patterns may be spaced apart from each other in the second direction. The second opening may overlap the gate structure 130. Thereafter, an insulation pattern may be formed to fill the second opening. In an exemplary embodiment, the insulation pattern may include a nitride, such as silicon nitride. However, exemplary embodiments of the present inventive concepts are not limited thereto.

As shown in the exemplary embodiment of FIG. 22, the first insulating interlayer 180 may be etched, and then the second buffer insulation layer 136, the first buffer insulation layer 134a, and a portion of the substrate 100 may be etched to form third openings 182 exposing the surface of the substrate 100.

In the etching process, upper portions of the buried insulation layer pattern and the first capping layer pattern 128a adjacent to the first active pattern 104 may also be etched.

The upper surfaces of the first buffer insulation layer 134a and the second buffer insulation layer 136 may be uniform, so that the first and second buffer insulation layers 136 may be uniformly be etched during the etching process for forming the third openings 182. Therefore, the levels of the lowermost surfaces of the third openings 182 may be uniform with respect to each other over the entire of the substrate 100. As shown in exemplary embodiment of FIG. 23, a difference d between a maximum height and a minimum height of the lowermost surfaces of the third openings 182 may be less than about 50 Å.

As described above, levels of the lowermost surfaces of the third openings 182 may be uniform, so that contact plugs formed in the third openings 182 may have uniform electrical characteristics.

If upper surfaces of the first buffer insulation layer 134a and the second buffer insulation layer 136 are non-uniform, the thicknesses of the first and second buffer insulation layers 134a and 136 may be locally different. In the etching process for forming the third openings 182, etching amounts of the first and second buffer insulation layers 134a and 136 may be different depending on the positions thereof. Therefore, the levels of the lowermost surfaces of the third openings 182 may be different depending on positions of the substrate 100.

Figure 24:
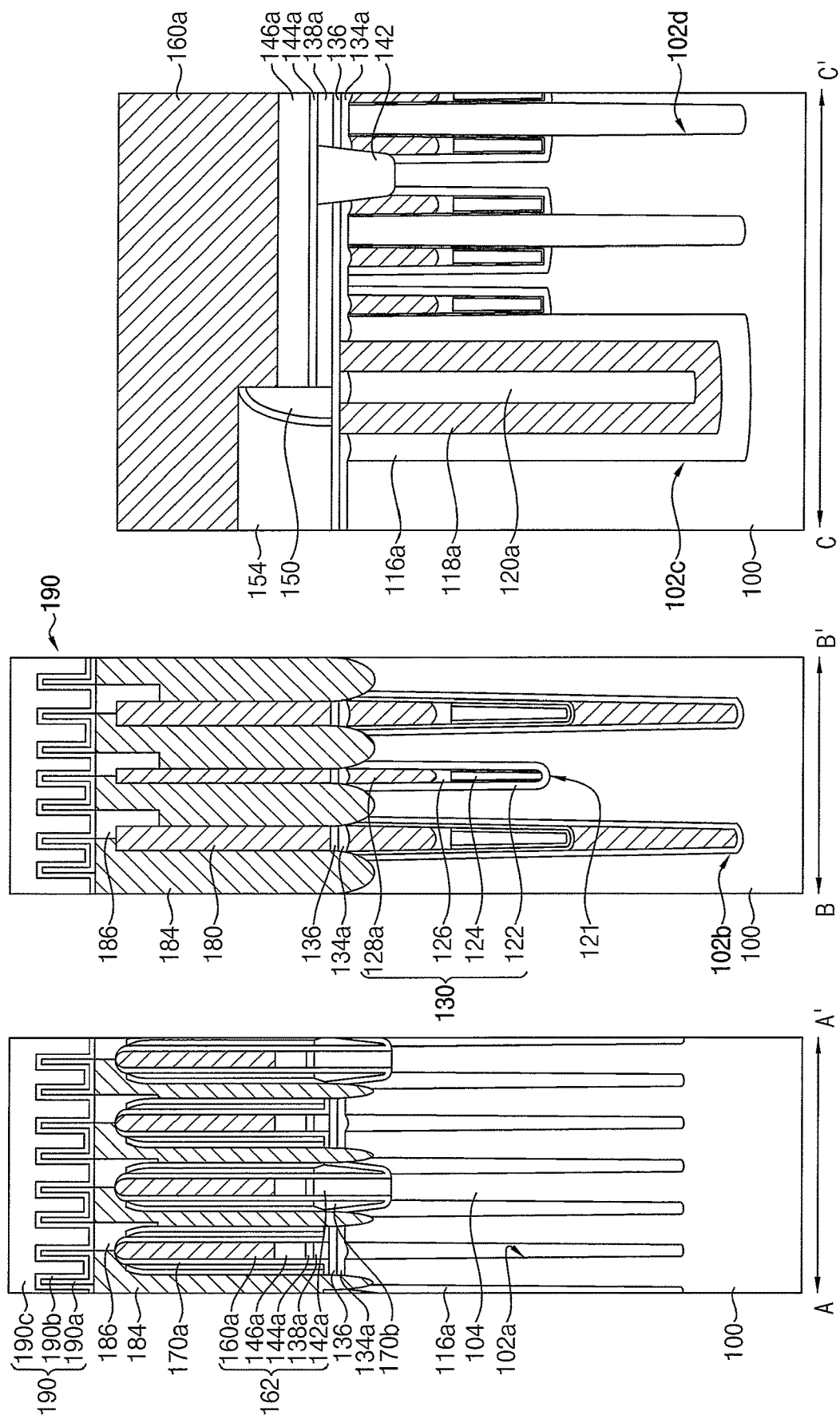

Referring to the exemplary embodiment of FIG. 24, upper contact plugs 184 may be formed to fill the third openings 182. The upper contact plug 184 may have an upper surface that is higher than an upper surface of the bit line structure 162. An upper insulation pattern 186 may be formed to fill a space between the upper contact plugs 184.

A capacitor 190 may be formed on upper surfaces of the upper contact plug 184 and the upper insulation pattern 186.

The previously described processes provide the manufacture of the DRAM device shown in the exemplary embodiment of FIG. 24.

The DRAM device may have following structural features. The structural features of the DRAM device have been mostly described in the processes of manufacturing the DRAM. Therefore, hereinafter, repeated descriptions may be omitted for convenience of explanation and only important parts may be described with reference to the drawings.

Referring to the exemplary embodiments of FIGS. 23 and 24, the semiconductor device may be formed on the substrate. The semiconductor device may include gate structures 130, bit line structures 162, spacer structures 170, upper contact plugs 184 and a capacitor 190.

The substrate 100 may include first and second regions I and II. The substrate 100 may include first to fourth trenches 102a, 102b, 102c, 102d, and an insulation material may fill the first to fourth trenches 102a, 102b, 102c, 102d.

The first buried insulation layer pattern 116a may fill the first trench 102a and the fourth trench 102d in the first region I. In an exemplary embodiment, the first buried insulation layer pattern 116a may include silicon oxide. The first buried insulation layer pattern 116a and the second insulation layer pattern 114 may fill the second trench 102b in the first region I. In an exemplary embodiment, the second insulation layer pattern 114 may include silicon nitride.

The first buried insulation layer pattern 116a, the second buried insulation layer pattern 18a, and the third buried insulation layer pattern 120a may fill the third trench 102c in the second region II. In an exemplary embodiment, the second buried insulation layer pattern 118a may include silicon nitride. In an exemplary embodiment, the first and third buried insulation layer patterns 16a and 120a may include silicon oxide.

The first buried insulation layer pattern 116a, the second buried insulation layer pattern 118a, and the third buried insulation layer pattern 120a may be sequentially stacked on the surface of the third trench 102c. An upper surface of the second buried insulation layer pattern 118a may be higher than upper surfaces of the first and third buried insulation layer patterns 116a and 120a. Therefore, the upper surface of the second buried insulation layer pattern 118a may protrude from the upper surfaces of the first and third buried insulation layer patterns 116a and 120a. The upper surface of the second buried insulation layer pattern 118a may be substantially flat.

A gate trench 121 extending in the first direction may be disposed on the substrate 100 in the first region I, and the gate structure 130 may be disposed in the gate trench 121. A portion of the gate structure 130 may be disposed on the first buried insulation layer pattern 116a and the second insulation layer pattern 114. For example, a plurality of gate structures 130 which extend in the first direction may be disposed in the first area I and may be arranged in the second direction.

The gate structure 130 may include the gate insulation layer 122, the gate electrode 124, the polysilicon pattern 126, and the first capping layer pattern 128a. An upper surface of the first capping layer pattern 128a may include the dimple portion 132, and the upper surface of the first capping layer pattern 128a may not be uniform. Further, an upper surface of the first active pattern 104 between the first capping layer patterns 128a may also not be uniform. For example, an upper surface of the first active pattern may also include a dimple portion.

The first buffer insulation layer 134a may be disposed on the substrate 100 in the first and second regions I and II. The second buffer insulation layer 136 may be disposed on the first buffer insulation layer 134a.

An upper surface of the first buffer insulation layer 134a may be substantially flat. The first buffer insulation layer 134a may be formed on the first capping layer pattern 128a having a non-uniform upper surface. Therefore, a lower surface of the first buffer insulation layer 134a may not be uniform.

A flatness of the upper surface of the first buffer insulation layer 134a may be different from a flatness of the lower surface of the first buffer insulation layer 134a. For example, as shown in the exemplary embodiment of FIGS. 23-24, the upper surface of the first buffer insulation layer 134a may be substantially flat and may have a greater level of flatness than the level of flatness of the lower surface of the first buffer insulation layer 134a.

In an exemplary embodiment, the first buffer insulation layer 134a may have a thickness in a range of about 35 Å to about 100 Å.

The first buffer insulation layer 134a disposed on the second region II may be separated (e.g., spaced apart in the second direction) by the second buried insulation layer pattern 118*a*. For example, the first buffer insulation layer 134*a* may be disposed on upper sidewalls of the second buried insulation layer pattern 118*a* on the second region II. The upper surfaces of the first buffer insulation layer 134*a* and the second buried insulation layer pattern 118*a* may be substantially coplanar with each other. The upper surfaces of the first buffer insulation layer 134*a* and the second buried insulation layer pattern 118*a* may have a substantially same level (e.g., height in a thickness direction of the substrate 100).

The second buffer insulation layer 136 may have a substantially flat upper surface and a substantially flat lower surface. In an exemplary embodiment, the second buffer insulation layer 136 may have a thickness in a range of about 35 to about 100 Å.

The second buffer insulation layer 136 on the second region may be disposed on the first buffer insulation layer 134*a* and the second buried insulation layer pattern 118*a*.

In an exemplary embodiment, the first buffer insulation layer 134*a* may include silicon oxide, and the second buffer insulation layer 136 may include silicon nitride. In an exemplary embodiment, a third buffer insulation layer may be further disposed on the second buffer insulation layer 136.

A lower surface of the bit line structure 162 may contact the second buffer insulation layer 136 in the first region I and the second region II and a second portion of the bit line structure 162 may contact the first active pattern 104. For example, the bit line structure 162 may be disposed directly on the second buffer insulation layer 136 and the first active pattern 104. The bit line structure 162 may include the conductive pattern, the barrier pattern 144*a*, the first metal patterns 146*a*, and the upper capping layer patterns 160*a* sequentially stacked. The bit line structure 162 may extend from the first region I to the second region II.

The upper surface of the second buffer insulation layer 136 may be substantially flat, and thus the lower surface of the bit line structure 162 contacting the second buffer insulation layer 136 may be substantially flat.

A portion of the first active pattern 104 contacting the second portion of the bit line structure 162 may be recessed as compared to a portion of the first active pattern 104 positioned under the first buffer insulation layer 134*a*. The second opening may be disposed at the first active pattern 104, and a bottom of the second opening may contact the bit line structure 162.

The spacer structure 170 may be disposed on a sidewall of the bit line structure 162.

The third openings 182 may expose the first active pattern 104 between the bit line structures 162. In an exemplary embodiment, the levels of lowermost surfaces of the third openings 182 may be substantially uniform with respect to each other. For example, in an exemplary embodiment, a difference d between a maximum height and a minimum height of the lowermost surfaces of the third openings 182 may be less than about 50 Å.

The first insulating interlayer 180 may cover the bit line structures 162 to fill a space between the bit line structures 162.

The upper contact plug 184 may be disposed in the third openings 182 and may contact the first active pattern 104 exposed by the bottom surface of the third opening 182. As shown in the exemplary embodiment of FIG. 24, an upper surface of the upper contact plug 184 may have a height that is higher than the height of an upper surface of the bit line structure 162. An upper insulation pattern 186 may fill a space between the upper contact plugs 184.

The capacitor 190 may contact the upper surface of the upper contact plug 184.

The semiconductor device may include the first buffer insulation layer 134*a* and the second buffer insulation layer 136 having substantially flat upper surfaces. Therefore, a bottom of the bit line structure 162 disposed on the second buffer insulation layer 136 may be substantially flat.

In addition, the levels of the lowermost surfaces of the third openings 182 formed between the bit line structures 162 may be uniform with respect to each other. Therefore, the upper contact plugs 184 filling the third openings 182 may have uniform characteristics.

A lower surface and an upper surface of the bit line structure 162 on the second region may be substantially flat. For example, the second buried insulation layer pattern 118*a* on the second region may not include the protrusion. Therefore, the bit line structure 162 may not be disposed on a protrusion, and cutting defects of the bit line structure 162 due to a protrusion may be decreased.

The foregoing is illustrative of exemplary embodiments of the present inventive concepts and is not to be construed as limiting thereof. Although a few exemplary embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor device, comprising:
   a substrate including a first region having a first trench and a second region having a second trench;
   a first buried insulation layer pattern disposed in the first trench;
   the second trench includes the first buried insulation layer pattern, a second buried insulation layer pattern, and a third buried insulation layer pattern sequentially stacked therein, the upper surface of the second buried insulation layer pattern in the second trench protrudes from upper surfaces of the first and third buried insulation patterns in the second trench;
   a first buffer insulation layer disposed on the substrate in the first and second regions, the first buffer insulation layer having a flat upper surface;
   a second buffer insulation layer disposed on the first buffer insulation layer; and
   a bit line structure disposed on the first and second regions,
   wherein a first portion of the bit line structure is disposed on the second buffer insulation layer, and the first portion of the bit line structure has a flat lower surface, and
   wherein a second portion of the bit line structure directly contacts a surface of the substrate in the first region.

2. The semiconductor device of claim 1, wherein the bit line structure disposed on the second region has a flat upper surface and a flat lower surface.

3. The semiconductor device of claim 1, wherein a plurality of portions of the first buffer insulation layer along a lateral direction is separated from each other by the second buried insulation layer pattern in the second region.

4. The semiconductor device of claim 1, wherein an upper surface of the second buried insulation layer pattern on the second region is coplanar with an upper surface of the first buffer insulation layer.

5. The semiconductor device of claim 1, wherein the second buffer insulation layer on the second region is disposed on the first buffer insulation layer and the second buried insulation layer pattern.

6. The semiconductor device of claim 1, wherein:
the bit line structure includes a plurality of bit line structures; and
openings are disposed between the bit line structures, the openings exposing portions of the substrate,
wherein a difference between a maximum height and a minimum height of lowermost surfaces of the openings is less than about 50 Å.

7. The semiconductor device of claim 1, wherein:
the first region includes a plurality of memory cells;
the second region surrounds an edge of the first region and includes a plurality of dummy cells; and
a width of the second trench is greater than a width of the first trench.

8. The semiconductor device of claim 1, wherein a thickness of the first buffer insulation layer is in range of about 35 Å to about 100 Å.

9. A semiconductor device, comprising:
a substrate including a first region having a first trench and a gate trench and a second region having a second trench;
a first buried insulation layer pattern disposed in the first trench;
the second trench includes the first buried insulation layer pattern, a second buried insulation layer pattern, and a third buried insulation layer pattern sequentially stacked therein;
a first buffer insulation layer disposed on the substrate in the first and second regions, the first buffer insulation layer having a flat upper surface, wherein a flatness of an upper surface of the first buffer insulation layer is greater than a flatness of a lower surface of the first buffer insulation layer;
a second buffer insulation layer disposed on the first buffer insulation layer;
a gate structure disposed in the gate trench; and
a bit line structure disposed on the first and second regions, the bit line structure extending from the first region to the second region,
wherein a first portion of the bit line structure is disposed on the second buffer insulation layer, and the first portion of the bit line structure has a flat lower surface,
wherein a second portion of the bit line structure directly contacts a surface of the substrate in the first region, and
wherein the bit line structure disposed on the second region has a flat upper surface and a flat lower surface.

10. The semiconductor device of claim 9, wherein an upper surface of the second buried insulation layer pattern on the second region is coplanar with an upper surface of the first buffer insulation layer in the second region.

11. A method of manufacturing a semiconductor device, comprising:
etching a substrate including a first region and a second region to form a first trench in the first region and a second trench in the second region;
forming a first buried insulation layer pattern in the first trench;
sequentially stacking the first buried insulation layer pattern, a second buried insulation layer pattern and a third buried insulation layer pattern in the second trench;
forming a first buffer insulation layer on the substrate in the first and second regions, the first buffer insulation layer having a flat upper surface, wherein a flatness of an upper surface of the first buffer insulation layer is greater than a flatness of a lower surface of the first buffer insulation layer;
forming a second buffer insulation layer on the first buffer insulation layer; and
forming a bit line structure on the first and second regions, wherein a first portion of the bit line structure is formed on the second buffer insulation layer, and the first portion of the bit line structure has a flat lower surface.

12. The method of claim 11, wherein the forming of the first buffer insulation layer comprises:
forming a preliminary first buffer insulation layer on the substrate in the first and second regions; and
planarizing an upper surface of the preliminary first buffer insulation layer to form the first buffer insulation layer.

13. The method of claim 12, wherein the preliminary first buffer insulation layer is formed to have a thickness that is about 1.5 times to about 3 times greater than a thickness of the first buffer insulation layer.

14. The method of claim 12, wherein the planarizing includes performing a chemical mechanical polishing process.

15. The method of claim 12, wherein:
the second buried insulation layer pattern on the second region is polished during the planarizing of the preliminary first buffer insulation layer, wherein an upper surface of the second buried insulation layer pattern is coplanar with an upper surface of the first buffer insulation layer after the planarizing process.

16. The method of claim 11, wherein the first buffer insulation layer is formed to have a thickness in a range of about 35 Å to about 100 Å.

17. The method of claim 11, wherein the second buffer insulation layer on the second region is formed on the first buffer insulation layer and the second buried insulation layer pattern.

18. The method of claim 11, wherein:
the forming of the bit line structure includes forming a plurality of bit line structures on the first and second regions; and
etching portions between the bit line structures to form openings that expose the substrate between the bit line structures.

19. The method of claim 11, further comprising:
forming a gate trench in the first region; and
forming a gate structure in the gate trench.

* * * * *